(12) United States Patent
Kawahara et al.

(10) Patent No.: US 7,405,588 B2
(45) Date of Patent: Jul. 29, 2008

(54) DEVICE AND DATA PROCESSING METHOD EMPLOYING THE DEVICE

(75) Inventors: Takayuki Kawahara, Higashiyamato (JP); Masayuki Miyazaki, Tokyo (JP); Yasushi Goto, Kokubunji (JP); Natsuki Yokoyama, Mitaka (JP); Takahiro Onai, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/933,272

(22) Filed: Sep. 3, 2004

(65) Prior Publication Data

US 2005/0104621 A1 May 19, 2005

(30) Foreign Application Priority Data

Nov. 18, 2003 (JP) .............................. 2003-387359

(51) Int. Cl.
*H03K 19/173* (2006.01)
(52) U.S. Cl. .......................................... 326/38; 326/41
(58) Field of Classification Search ............. 326/37–38, 326/41–50
See application file for complete search history.

(56) References Cited

U.S. PATENT DOCUMENTS 4,979,149 A * 12/1990 Popovic et al. .............. 365/244
5,805,477 A 9/1998 Perner
6,226,779 B1 * 5/2001 Baxter et al. .................. 716/16
6,621,293 B2 * 9/2003 Wingen ........................ 326/37
6,667,873 B2 * 12/2003 Lyke et al. ................... 361/160

FOREIGN PATENT DOCUMENTS

JP 10-111790 8/1997
JP 11-330254 5/1998

OTHER PUBLICATIONS

Beat Halg, "On a Micro-Electro-Mechanical Nonvolatile Memory Cell", IEEE Transactions on Elecron Devices (Oct. 1990), pp. 2230-2236.
R. T. Edwards et al., "Breaking the Resistivity Barrier", IEEE (Jul. 2001), Proceedings of the Third NASA/DoD Workshop on Evolvable Hardware, pp. 167-171.

* cited by examiner

*Primary Examiner*—James H Cho
(74) *Attorney, Agent, or Firm*—Reed Smith LLP; Stanley P. Fisher, Esq.; Juan Carlos A. Marquez, Esq.

(57) ABSTRACT

The present invention relates to an LSI in which functions can be changed, and realizes, particularly, a system LSI in which functions are changed by changing connections of the circuit by use of MEMS switches. A bistable MEMS switch which can maintain states, and exhibits optimal stitching property, i.e., the switch has a very small resistance of several Ω or less in an on-state, and has an infinite resistance in an off-state; is employed. An element in which functions can be changed during operation, is produced by utilizing a wiring layer of a CMOS semiconductor to form the MEMS switch. A semiconductor device exhibiting high-degree of freedom for changing functions, high-speed, and having small area, is realized.

17 Claims, 44 Drawing Sheets

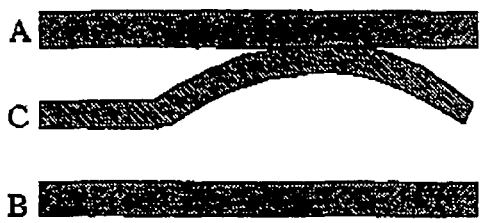
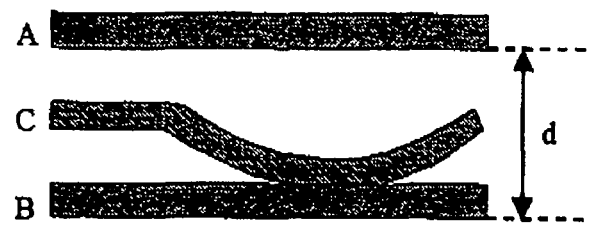
FIG.5A  FIG. 5D
FIG. 5B  FIG. 5E
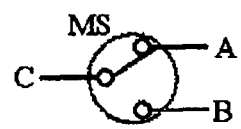
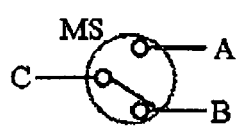
FIG. 5C  FIG. 5F

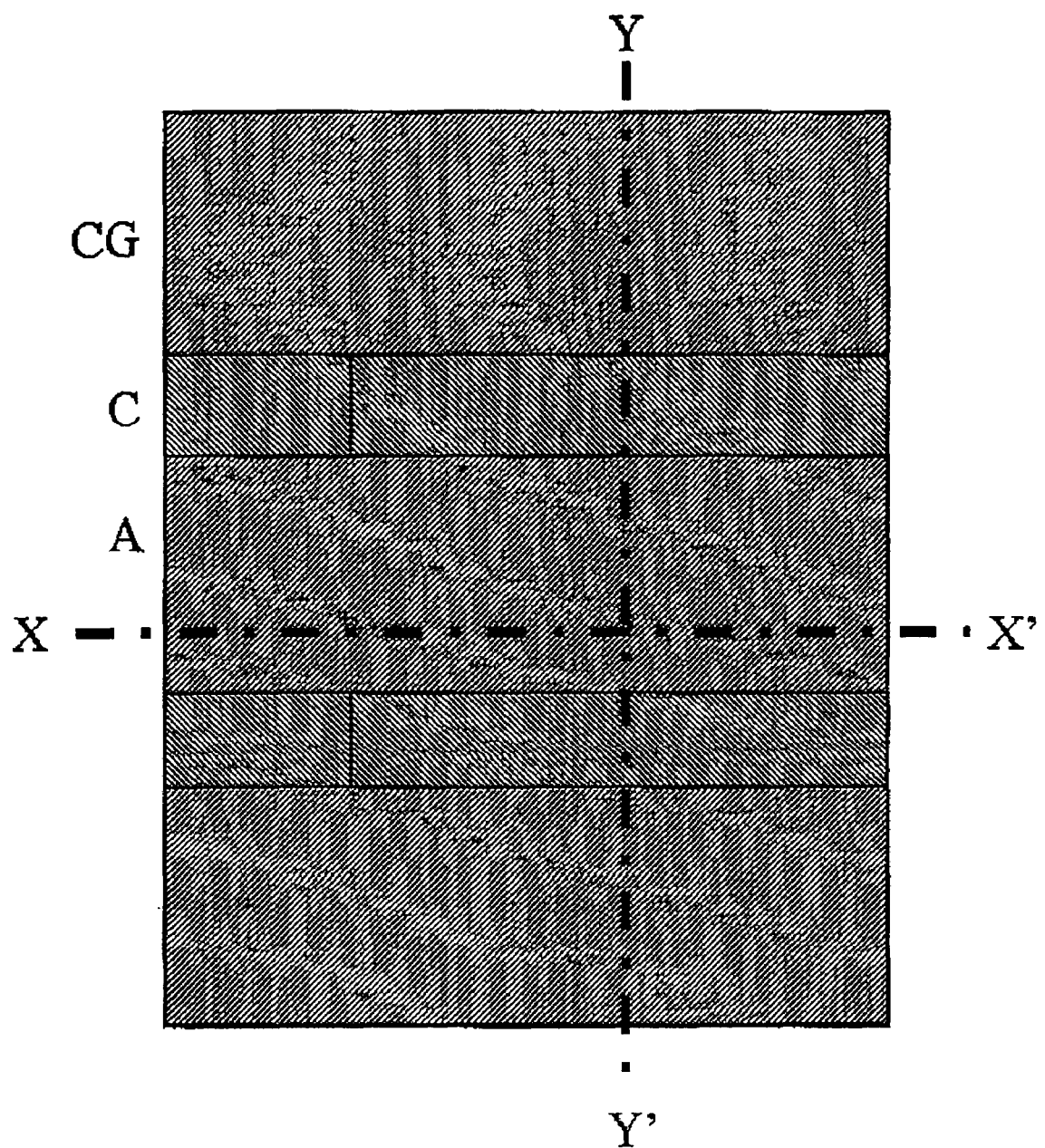

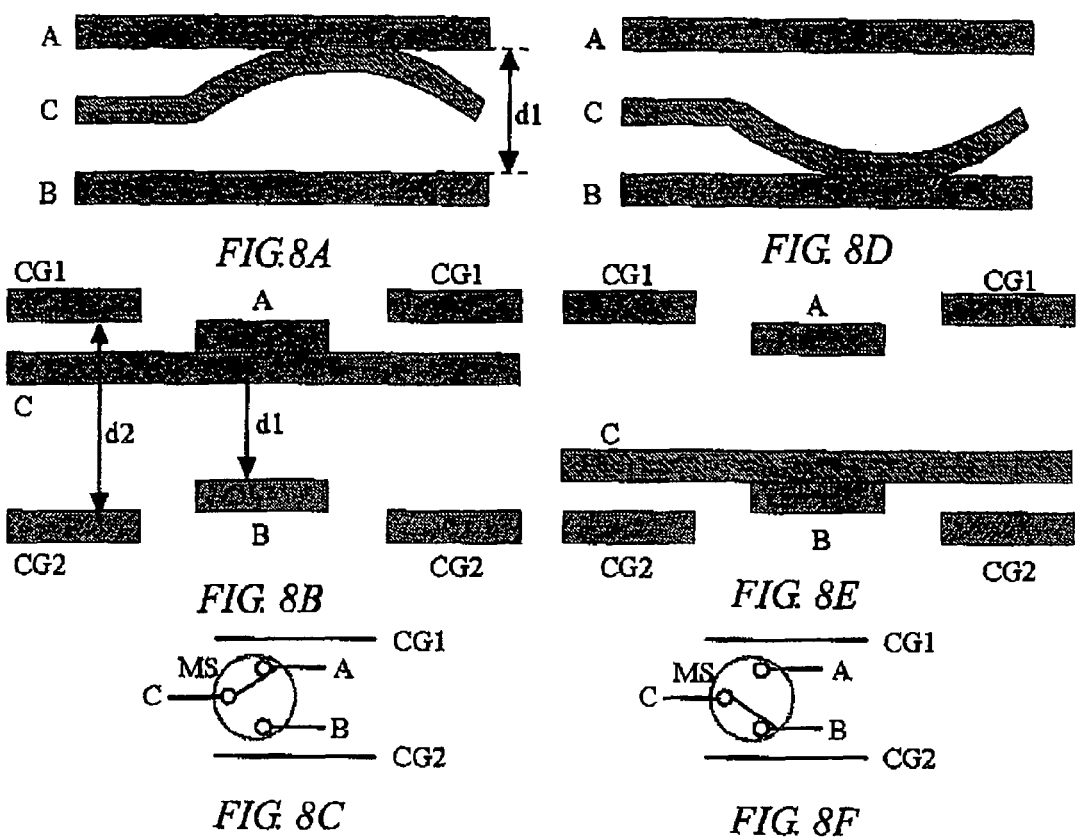

| | OPERATION VOLTAGE | INSULATING FILM THICKNESS |
|---|---|---|
| ST1 REGION | 2.5V | 7nm |
| CELL11 REGION | 0.9V | 1.8nm |

*FIG. 14*

|  | CEL31 | CEL32 | CEL33 |
|ST3| CEL41 | CEL42 | CEL43 |
|  | CEL51 | CEL52 | CEL53 |

ST4

$O = \overline{A*B + C*D}$ $O = \overline{(A+B)*(C+D)}$

FIG. 17
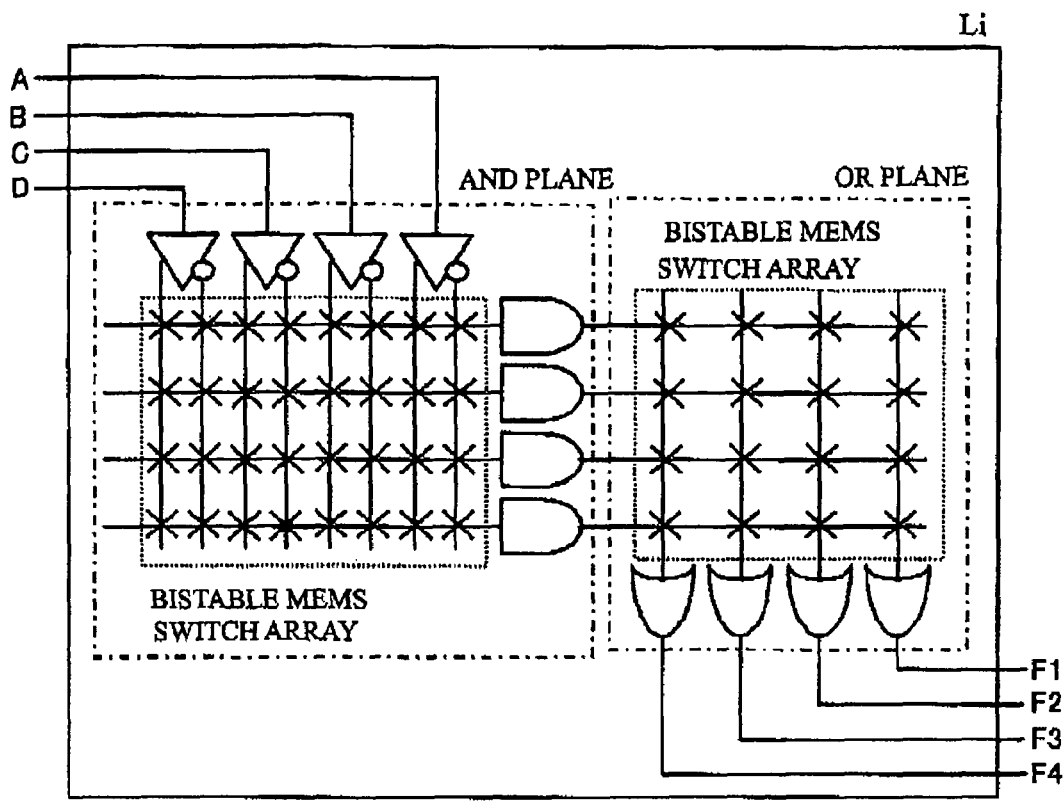
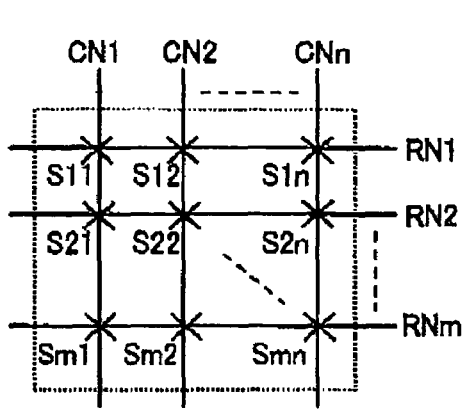
FIG. 18A
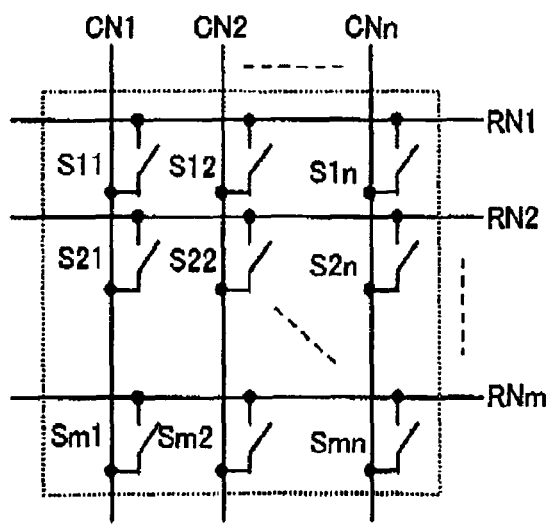
FIG. 18B

DEVICE AND DATA PROCESSING METHOD EMPLOYING THE DEVICE

CROSS-REFERENCE TO RELATED APPLICATION

The present application claims priority from Japanese Patent Application No. JP 2003-387359 filed on Nov. 18, 2003, the content of which is hereby incorporated by reference into this application.

TECHNICAL FIELD OF THE INVENTION

The present invention relates to a large scale integration circuit (LSI) in which functions thereof are changeable, particularly to an LSI in which functions thereof are changeable by changing the connections in the circuit by employing a mechanical element switch (a typical example is a MEMS (Micro-Electro-Mechanical Systems) switch), and also relates to a data processing method employing the LSI.

BACKGROUND OF THE INVENTION

Conventionally, there has been an art in which a computing circuit is composed by employing a variable logic unit, for example, that known as FPGA (Field Programmable Gate Array) or FPLD (Field Programmable Logic Device) (for example, see Japanese Patent Application Laid-Open Publication No. 10-111790, hereinafter Patent Document 1). Also, there have been conventional arts relating to a method, structure, property, operation, and forming method onto CMOS, of a switch that realizes two stable states (bistable states), (for example, see "On a Micro-Electro-Mechanical Nonvolatile Memory Cell", written by Beat Halg, IEEE published in October 1990, "IEEE Transactions on Electron Devices", pp. 2230-2236, published by IEEE, and "Breaking the Resistivity Barrier", written by R. T. Edwards and C. -J. Kim, IEEE published in July 2001, "Proceedings of the Third NASA/DoD Workshop on Evolvable Hardware", pp. 167-171, published by IEEE, as Non-Patent Documents 1 and 2). In addition, conventionally, a switch element for FPGA comprising wirings that are movable by the coulomb force, and capable of changing connections with low voltage, is provided (for example, see Japanese Patent Application Laid-Open Publication No. 11-330254, hereinafter Patent Document 2).

SUMMARY OF THE INVENTION

The conventional FPGA-based reconfigurable logic disclosed in the above described Patent Document 1 has the following problems.

Firstly, the configuration is changed by employing MOS switches, however, the MOS switches have a large resistance of several k$\Omega$. In addition, the plural switches are connected in series, thereby reducing the frequency by one digit. Also, a memory element is required to store the state of switches.

Secondly, due to the large resistance, MOS switches cannot be arranged in small switching units for changing functions. Therefore, application to a system in which functions are changed by fine parts (small logic units), for example, cellular automata, and a large function is realized by the collections of the parts; is not possible. Even if the application is possible, the speed will be very slow, and the device will be no more than an experimental system for confirming the principles.

Thirdly, there made an attempt with a system in which a programmable microcomputer is embedded and required accelerators are configured by FPGA when needed; however, the attained frequency is one digit lower than the usable frequency of the microcomputer because of the above described first reason. Therefore, aimed effects cannot be attained.

Meanwhile, the conventional switch element for FPGA disclosed in the above described Patent Document 2 has the following problems. The MEMS switch employed herein employs a system in which movable wirings are prepared and the wirings are moved by the coulomb force, therefore, the MEMS switch itself does not have two mechanical stable states in terms of the structure.

Next, the problems of the structure disclosed in the Patent Document 2 will be explained in detail by use of the reference numerals of the document. In FIG. 1 of the document, when voltage is applied to a controlling wiring 20; the coulomb force is generated between a movable wiring 30 and the controlling wiring 20, the coulomb force moves the movable wiring 30 in a downward direction in the drawing along rails, and the movable wiring 30 halts at the position where it comes into contact with the connection wirings 11 and 12. However, this halted state is maintained by the voltage applied to the controlling wiring 20. Therefore, when the application of voltage is cutoff, the halted state cannot be maintained and the movable wiring 30 is moved to the upward direction in the drawing by vibrations or the like. As a result, the electrical continuity between the connection wirings 11 and 12 may be cut. The reason for this is that the movable wiring 30 undergo no transition of state in terms of mechanical stability during the time when the movable wiring 30 is moved and come into contact with the connection wirings 11 and 12. That is, each of the three states, before the movement, after the movement, and during the movement, has potential energies, which indicates mechanical stability, almost equal to one another. In other words, the wiring does not undergo transition of state in which a state having a minimum value, in terms of energy, transits to a state having a maximum value, then to another state having a minimum value. Since the movement to both sides is restricted, in a sense, the state merely spatially moves in a flat square well potential having walls of two infinite potentials. Therefore, the structure is not mechanically bistable, and the structure cannot be applied to a bistable switch.

As described above, the structure disclosed in the above described Patent Document 2 is not mechanically bistable, therefore, an additional circuit for maintaining the state has to be provided, and otherwise, the changed function cannot be maintained. Therefore, electric power consumption and the chip area are increased, which is problematic.

An object of the present invention is to solve the above described first to third problems and to realize an element which is able to maintain states, change functions during operation, and exhibits optimal switching property, i.e., the element has a very small resistance of several $\Omega$ or less in an on-state, and an infinite resistance in an off-state.

Another object of the present invention is to realize an LSI configuration in which functions of circuit blocks can be changed by use of bistable MEMS switches, by providing structural improvements of a MEMS switch which are necessary for employing as a bistable MEMS switch for changing LSI functions.

The summary of the typical inventions disclosed in the present application for achieving the above described objects, will be simply explained as the following.

A device of the present invention comprises at least one variable logic gate array unit; wherein at least one said variable logic gate array unit comprises a MEMS switch element for switching a connection in the variable logic gate array unit, and the MEMS switch element has two stable states or a bistable state.

Preferably, the MEMS switch element is integrally formed in a CMOS integrated circuit with the variable logic gate array unit.

Preferably, the device of the present invention is configured such that either state in the above described bistable state is specified according to a signal from outside the device.

The device of the present invention may further comprise at least one additional variable logic gate array unit; wherein the additional variable logic gate array unit and the above described variable logic gate-array unit can form a composite variable logic gate array, based on switching of the connection in the above described variable logic gate array unit by the MEMS switch element.

The variable logic gate array unit may comprise plural circuit blocks, and the plural circuit blocks are arranged in a matrix and form cellular automata in which the adjacent circuit blocks are able to communicate with each other.

In this case, specifically, the device may be configured such that, at least one of the plural circuit blocks is an AUR; the AUR comprises an AND plane which performs a product operation, an OR plane which is electrically connected with the AND plane and performs an addition operation, plural input gates connected to the AND plane, and output gates which are connected to the OR plane and provided in the same number with the input gates; and product and addition operations of the signals input from the plural input gates are performed, and the results of the product and addition operations are output from the output gates. Also, the variable logic gate array unit may be configured as described above.

The device may be configured such that, the variable logic gate array unit comprises at least one logic cell, at least one connection cell, and at least one switch cell; the logic cell, the connection cell, and the switch cell being arranged in a matrix; each of, at least one said logic cell, at least one said connection cell, and at least one said switch cell, is provided with the above described MEMS switch element; the logic function of the logic cell, including at least either one of NOR and NAND, is configured to be changeable by the MEMS switch element; the connections of the connection cell with a wiring and the corresponding, among plural logic cells, a logic cell, are configured to be changeable by the MEMS switch element; and the connection of the switch cell with the wiring is configured to be changeable by the MEMS switch element.

Also in this case, similarly to the above described case, preferably, the MEMS switch element is integrally formed in a CMOS integrated circuit with the variable logic gate array unit; and the device of the present invention is preferably configured such that, either state in the above described bistable state is specified according to a signal from outside the device.

The device may be configured such that the variable logic gate array unit comprises at least one logic block, and an interconnection block electrically and mutually connected with the logic block(s); the MEMS switch element is provided in each of the logic blocks and the interconnection block; the logic function of the logic block including at least either one of a register and a computing unit, is formed to be configurable by the MEMS switch element; and the interconnection of the interconnection block with the logic function which have been set in the logic block is configured to be switchable by the MEMS switch element.

Also in this case, similarly to the above described cases, preferably, the MEMS switch element is integrally formed in a CMOS integrated circuit with the variable logic gate array unit; and, preferably, the device of the present invention is configured such that either state in the above described bistable state is specified according to a signal from outside the device.

A device of the present invention comprises: a CPU; a bus electrically connected with the CPU; and a variable logic gate array unit electrically connected with the bus and electrically connected with the CPU via the bus; wherein the variable logic gate array unit comprises a MEMS switch element for switching the connection in the variable logic gate array unit, and the MEMS switch element has two stable states or a bistable state.

Also in this configuration, preferably, the MEMS switch element is integrally formed in a CMOS integrated circuit with the variable logic gate array unit; and the device of the present invention is preferably configured such that, either state in the above described bistable state is specified according to a signal from outside the device.

Also, the device of the present invention may further comprise a writing permission circuit which is able to receive signals from outside, electrically connected to the variable logic gate array unit, and transmits signals regarding the permission of writing to the variable logic gate array unit based on the signals from outside.

Also, the device may further comprise a wireless interface circuit which is able to receive signals from outside and electrically connected with the variable logic gate array unit; wherein the connection in the variable logic gate array unit is changeable based on the signals from outside received via the wireless interface circuit.

A data processing method employing the device of the present invention comprises: a step of preparing a processor comprising at least one variable logic gate array unit; a step of inputting data to the processor; and a step of outputting the processed results of the data by the processor in which the functions thereof are changed via the variable logic gate array unit; wherein at least one said variable logic gate array unit comprises a MEMS switch element for switching the connection in the variable logic gate array unit, and the MEMS switch element has two stable states or a bistable state.

The data processing method employing the device of the present invention may further comprise a step of inputting a program which specifies a processing method of the data for the processor; wherein the variable logic gate array unit changes the functions of the processor based on at least either one of the data and the program.

Also, the data processing method employing the device of the present invention may further comprise a step of inputting a function description which defines the function required for the processor, to the processor; wherein the processor further comprises a program generating circuit which gives signals to the variable logic gate array unit for function change, and the program generating circuit generates signals for said function change based on at least either one of the data and the function description.

Also, the data processing method employing the device of the present invention, may be configured such that, the processor further comprises a program generating circuit which gives signals to the variable logic gate array unit for function change, and a circuit for outputting function data to the program generating circuit; wherein the circuit for outputting function data generates the function data based on the above described data and gives the generated data to the program generating circuit, the program generating circuit generates signals for said function change based on the function data received from the circuit which outputs function data.

A device of the present invention may be configured such that the device changes a connection in a circuit by use of MEMS (Micro-Electro-Mechanical Systems) switch; wherein, specifically, the MEMS switch element has a bistable state, either state in the above described bistable state is specified according to a signal from outside, and the MEMS switch is integrally formed with, as a CMOS LSI, the circuit in which connections are changed.

Also, the device of the present invention may be configured such that the device changes the connection method of the circuit by use of the MEMS switch; wherein the circuit in which connections are changed is constituted by m-number of gates, and when n-number of circuits which are constituted by the m-number of gates are combined so as to constitute a circuit having a larger scale, the combinations between the n-number of circuits are switched by use of MEMS switches. Also, in this case, preferably, the MEMS switch has a bistable state, either state in the above described bistable state is specified according to a signal from outside, and the MEMS switch is integrally formed with, as a CMOS LSI, the circuit in which connections are changed.

Also, the device of the present invention may be a device including an FPGA (Field Programmable Gate Array) in which connections are changed by use of MEMS switches. Also in this case, preferably, the MEMS switch has a bistable state, either state in the above described bistable state is specified according to a signal from outside, and the MEMS switch is integrally formed with, as a CMOS LSI, the circuit in which connections are changed.

According to the present invention, an element in which functions are changed during operation by use of bistable MEMS switches is realized, therefore a device having a high degree of freedom for changing functions, particularly, as a representative example, a semiconductor device is realized.

BRIEF DESCRIPTION OF THE DRAWINGS

FIGS. 5A to 5F include diagrams showing a configuration example of a bistable MEMS switch;

FIG. 7 is a diagram showing a configuration example of a bistable MEMS switch provided with a controlling means;

FIGS. 8A to 8F include diagrams showing cross section and an equivalent switch circuit, of the configuration example of FIG. 7;

FIG. 14 is a diagram showing another arrangement of circuits including bistable MEMS switches, and controlling circuits thereof;

FIG. 17 is a diagram showing a fourth embodiment of the present invention;

FIGS. 18A and 18B includes diagrams for explaining a switch array;

DESCRIPTION OF THE PREFERRED EMBODIMENTS

Best modes of the present invention will be explained with reference to drawings. Herein, the following technical means will next be explained as embodiments: technical means for changing functions in a logic basic element (e.g., NAND element and NOR element) level; technical means for changing a new function which is realized by combination of logic elements having certain functions; and technical means in which the function change is performed not only by direct orders from outside but also autonomically for obtaining desired output from input data.

Figure 1A:
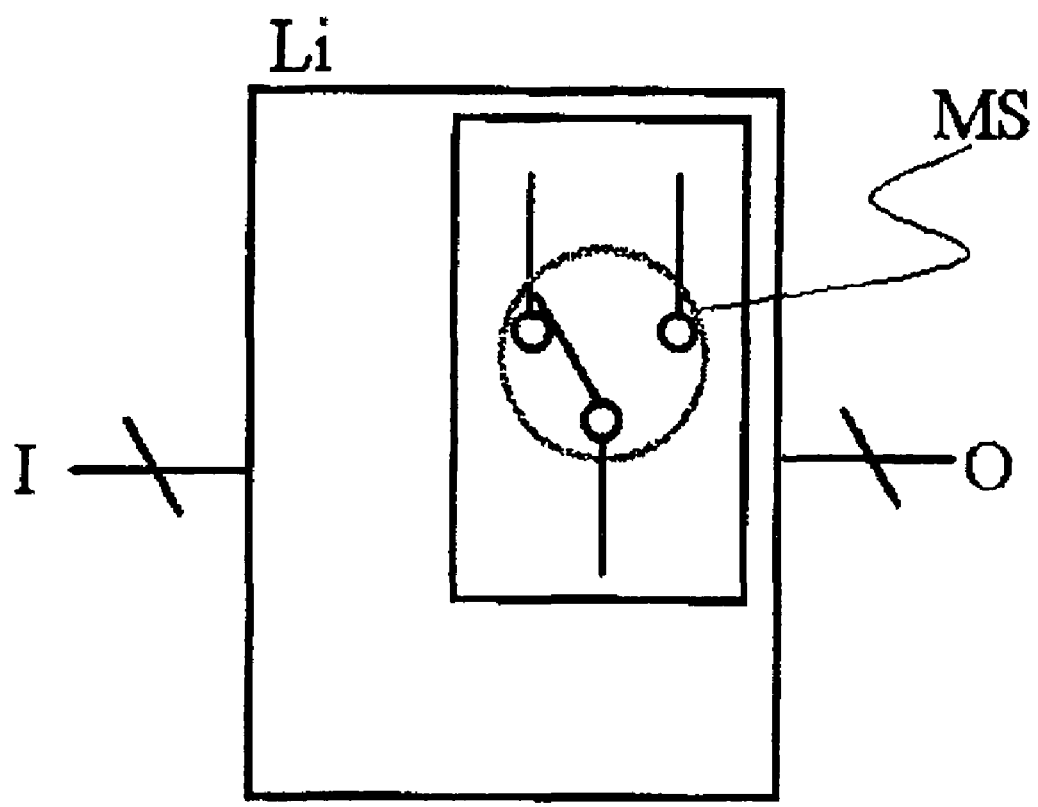
FIGS. 1A to 1C are diagrams showing a first embodiment which is a basic configuration example of the present invention.
Figure 1B:
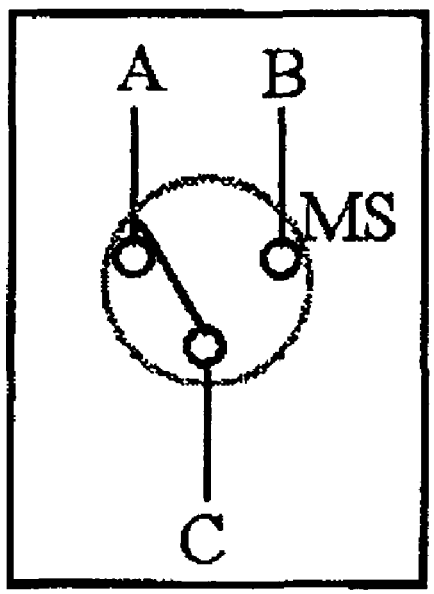
Figure 1C:
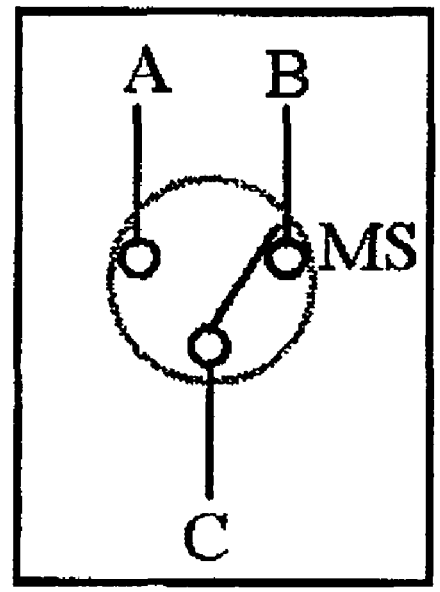

FIG. 1 is a diagram showing a means of the present invention for changing functions. In FIG. 1A, Li is a function circuit block, and I is the input and O is the output thereof. The Li can be used for plural functions by switching. For this purpose, at least a switch is required and MS serves as the switch. In the present invention, the switch is a bistable MEMS switch which employs MEMS structure (therefore, exhibiting optimal switching property, i.e., having a very small resistance of several $\Omega$ or less in an on-state, and an infinite resistance in an off-state) and the switch has a bistable state in which a state can be maintained. The structure of the switch itself will be described later. The term bistable means that the states such as those shown in FIGS. 1B or 1C is taken and the taken state is stable. That is, the switch has characteristics in which; when terminals A, B, and C are provided, the states that shown in, FIG. 1B wherein A and C are connected, or that shown in FIG. 1C wherein B and C are connected, can be taken; and either one of the states is maintained unless means or method is used for switching the state. By employing the switch, the state or function in Li can be changed by switching and the state or function is maintained stable in the above described sense, and the structure of Li will be described sequentially in the following embodiments.

Figure 2:
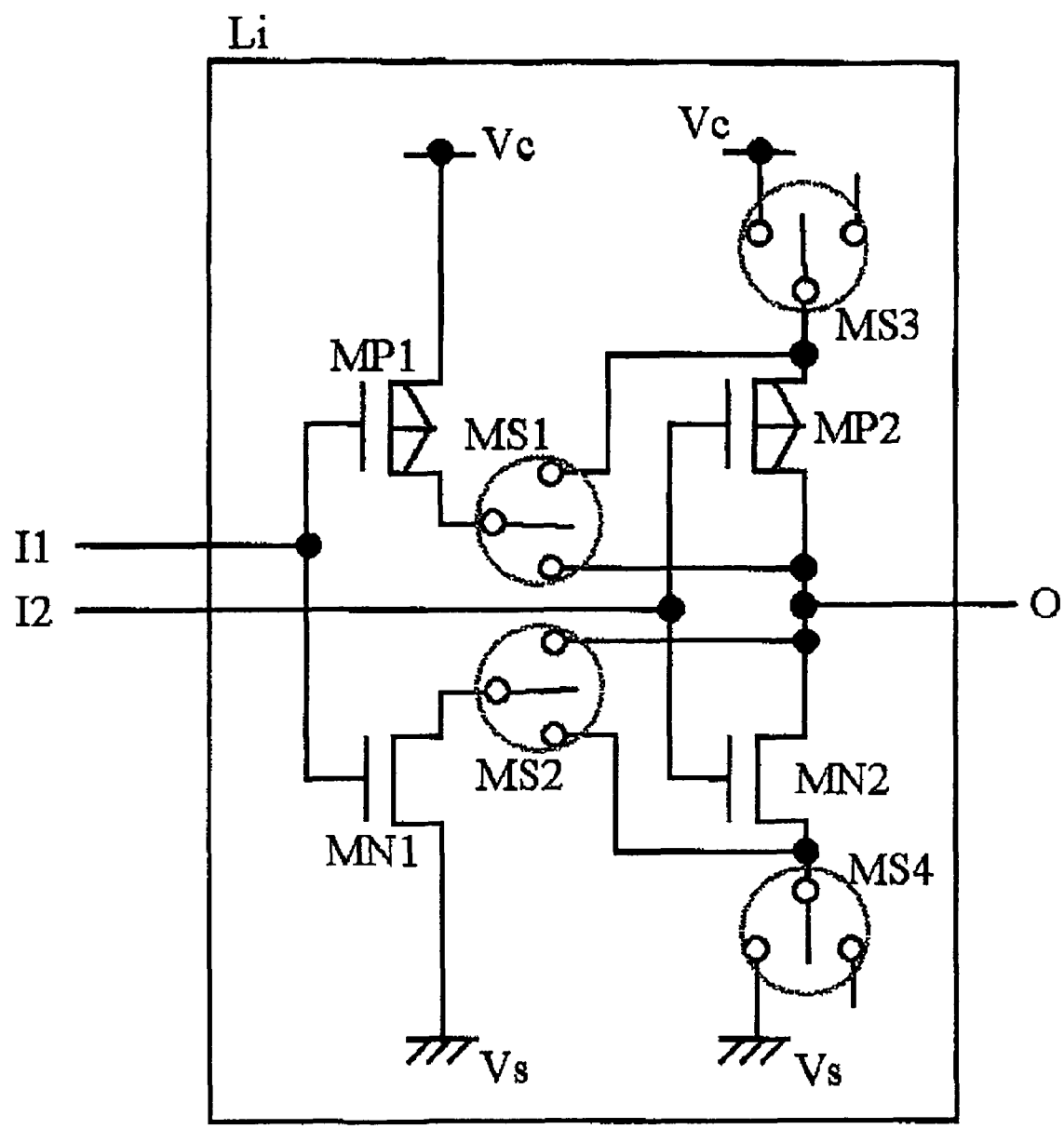
FIG. 2 is a diagram showing a second embodiment of the present invention.
Figure 3:
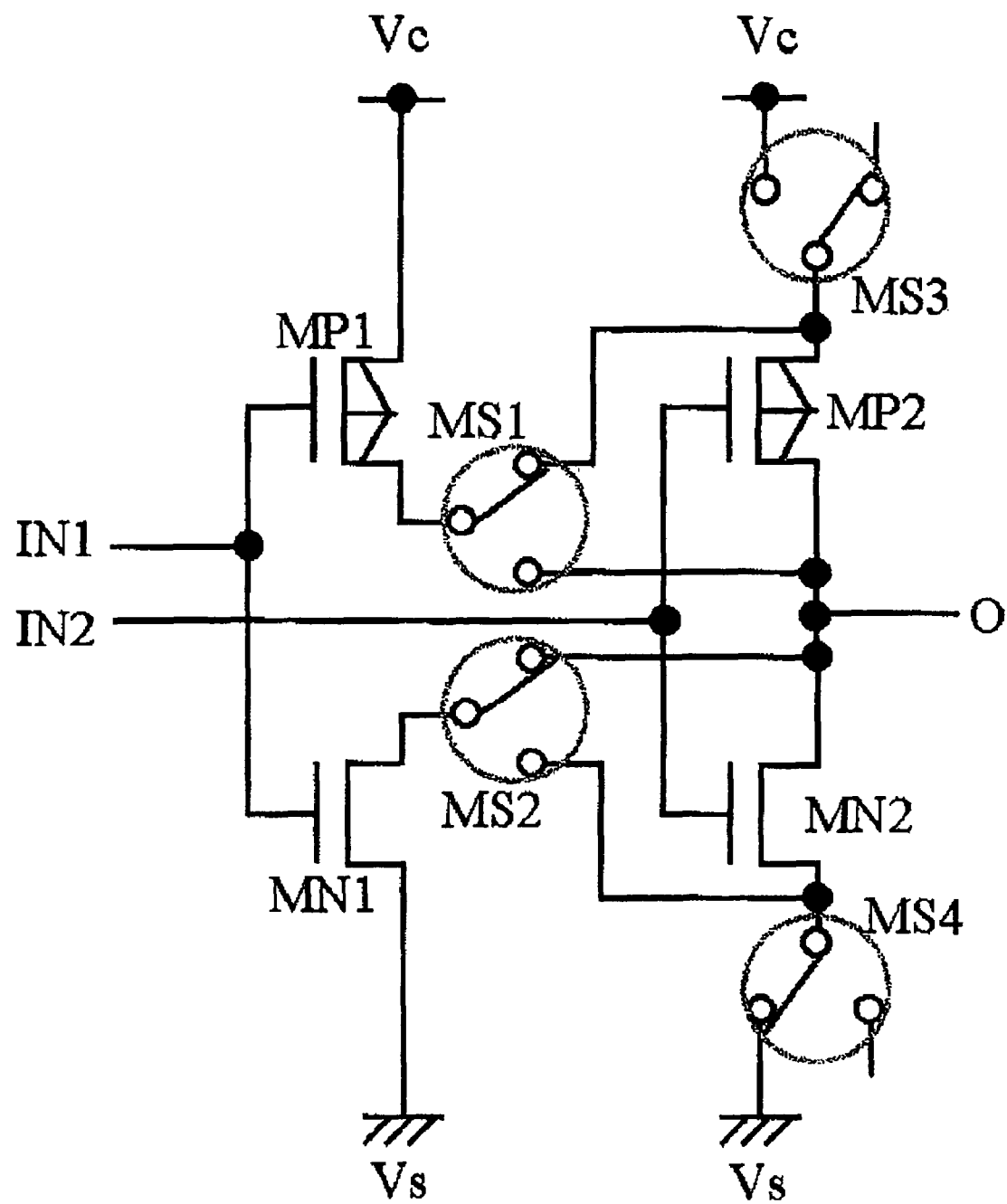
FIG. 3 is a diagram showing a function of the second embodiment of the present invention.
Figure 4:
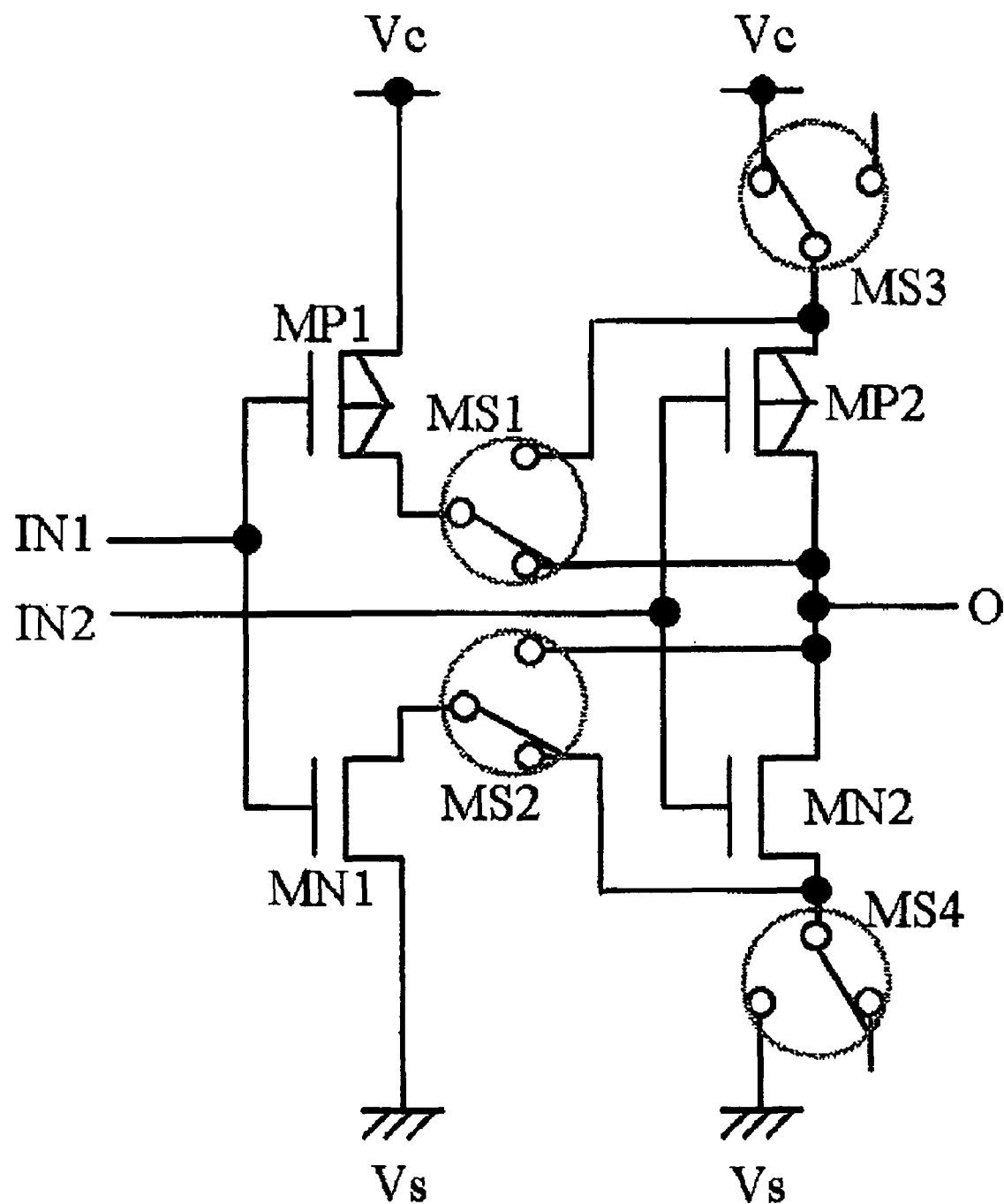
FIG. 4 is a diagram showing another function of the second embodiment of the present invention.

FIG. 2 is a diagram showing an embodiment in which the connections in Li are switched in a transistor-level so as to realize a different function. In the diagram, the function circuit block Li has inputs I1 and I2, output O, two pMOS transistors MP1 and MP2, two nMOS transistors MN1 and MN2, and four bistable MEMS switches MS1, MS2, MS3, and MS4. In the diagram, in terms of convenience of explanation, the bistable switches are virtually shown in the states not connected to either side. However, as shown in FIGS. 3 and 4, NAND function and NOR function can be used by switching (NOT function can also be realized). With these two functions, when a plurality number of them are employed, all operations that represented by Boolean algebra can be performed. That is, when one kind of elements shown in FIG. 2 is prepared in a plurality of numbers, such operations can be performed only by switching MEMS switches.

Next, the NAND function and the NOR function realized by the connection states of the four bistable MEMS switches MS1, MS2, MS3, and MS4 of FIG. 2, will be explained focusing on the wiring connections.

FIG. 3 shows an embodiment realizing a NOR function. MS1 is switched so as to serially connect pMOS transistors MP1 and MP2, and MS3 is switched so as to separate MP2 from a power source Vc. Meanwhile, MS2 is switched so as to connect nMOS transistors MN1 and MN2 in parallel, and MS4 is switched so as to connect a power source Vs and MN2. That is, MP1 to which an input I1 is connected at the gate and MP2 to which an input I2 is connected at the gate are connected in series between the power source Vc and an output O, and MN1 to which the input I1 is connected at the gate and MN2 to which the input I2 is connected at the gate are connected in parallel between the output O and the power source Vs, thereby forming a well known CMOS NOR circuit. This circuit is Li, therefore a function circuit block having NOR function is realized in Li.

FIG. 4 shows an embodiment realizing NAND function. MS1 is switched so as to connect pMOS transistors MP1 and MP2 in parallel, and MS3 is switched so as to connect a power source Vc and MP2. Meanwhile, MS2 is switched so as to connect nMOS transistors MN1 and MN2 in series, and MS4 is switched so as to separate a power source Vs and MN2. That is, MP1 to which an input I1 is connected at the gate and MP2 to which an input I2 is connected at the gate are connected in parallel between the power source Vc and an output O, and MN1 to which an input I1 is connected at the gate and MN2 to which input I2 is connected at the gate are connected in series between the output O and the power source Vs, thereby forming a well known CMOS NAND circuit. This circuit is Li, therefore a function circuit block having NAND function is realized in Li.

In the examples in FIG. 3 and FIG. 4, a NAND circuit and a NOR circuit are switched with two inputs, however, extension to a multi-input circuit having three or more inputs is easy. When there prepared a bistable MEMS switch which switches series connection and parallel connection of the pMOS transistors and nMOS transistors between the power source and the output, the function circuit block Li is provided with a means for switching a multi-input NAND function and NOR function.

Next, examples of realizing method and means of a bistable switch will be described. FIG. 5 and FIG. 6 show examples of switches which can be employed in the present invention, and which have been realized in experiments in the past. FIGS. 7 and 8 show the switch provided with a unique controlling means.

FIGS. 5A to 5F show a bistable switch utilizing the fact that a spring plate sandwiched between two plates has two stable states, i.e., upwardly convexed state and downwardly convexed state. Herein, FIG. 5A and FIG. 5D are cross sections, FIG. 5B and FIG. 5E are plan views, and FIG. 5C and FIG. 5F are diagrams showing states in terms of a switch. As shown in FIG. 5A and FIG. 5D, metal plates A and B are disposed a distance "d" away from each other and their planes being parallel to each other, and another metal plate C is disposed therebetween. In the cross sections of FIG. 5A and FIG. 5D, the metal plate C is curved, and has upwardly convexed state in FIG. 5A, wherein the metal plate C is in contact with the metal plate A and has no contact with the bottom metal plate B. This is represented by a circuit diagram of FIG. 5C. In FIG. 5D, the metal plate C has a downwardly convexed state, and is in contact with the bottom metal plate B, but has no contact with the upper metal plate A. This is represented by a circuit diagram FIG. 5F. In FIG. 5B and FIG. 5E, the width WA of the metal plate A is narrower than the width WC of the metal plate C so that they are easily distinguished. Even though it is not shown in FIG. 5B and FIG. 5E, there provided another metal plate B under the metal plate C as shown in the cross sections FIG. 5A and FIG. 5D. The width of the metal plate B is, for example, WA which is same as that of the plate A. The widths of the metal plate A, the metal plate B, and the metal plate C may be the same, may be in the reversed relation of the diagram, or may be, three of them, different to one another. When this structure is employed as a switching means, the bistable switch required in the present invention is realized. As described later, the structure can be made by employing a wiring layer of a semiconductor device. The detail of controlling method of the spring plate is described in the above described Non-Patent Document 1.

Figure 6A:
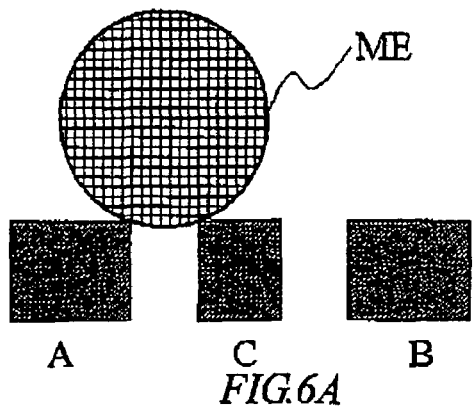
FIGS. 6A to 6F include diagrams showing another configuration example of a bistable MEMS switch.
Figure 6D:
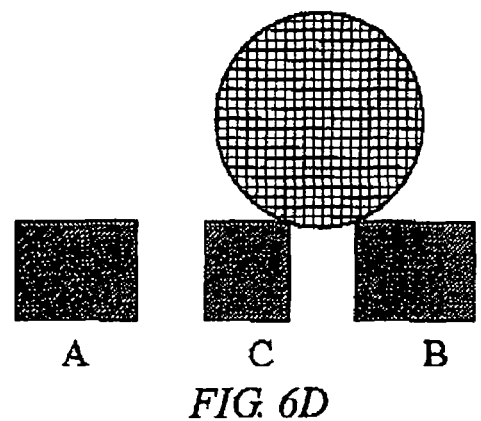
Figure 6B:
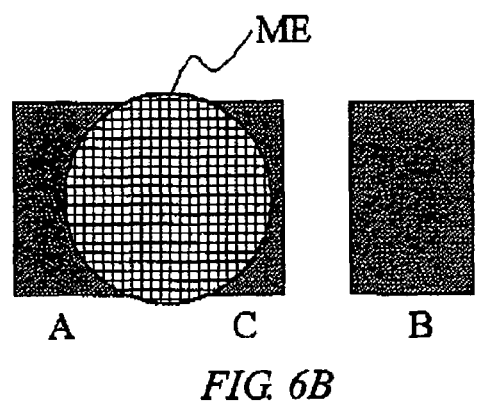
Figure 6E:
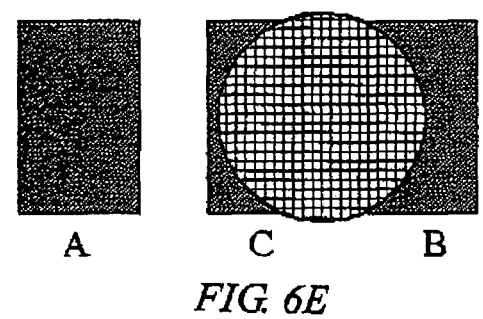
Figure 6C:
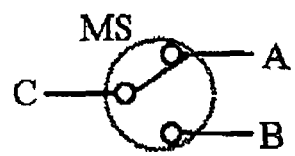
Figure 6F:
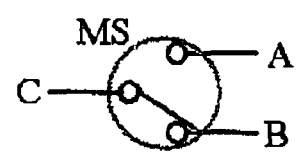

FIGS. 6A to 6F illustrate a switching method for realizing two stable states, by disposing a mercury droplet on top of three metal plates which are disposed at intervals, causing the mercury droplet to move by rolling, and short-circuiting two of the three metal pieces. In FIGS. 6A to 6F, FIG. 6A and FIG. 6D are cross sections, FIG. 6B and FIG. 6E are plan views, and FIG. 6C and FIG. 6F are diagrams showing states in terms of a switch. As shown in FIG. 6A and FIG. 6D, three metal plates A, C, and B are disposed at intervals, and a mercury droplet ME is placed on the top thereof. Herein, there taken two stable states, i.e., a state in which ME is caught in the gap between A and C, or a state in which ME is caught in the gap between C and B can be taken. Therefore, a bistable switch is realized, The functions required for the present invention are realized, as shown in FIG. 6C and FIG. 6F illustrating the corresponding switch states. The detailed controlling method of the mercury droplet is described in the above described Non-Patent Document 2.

Both of the spring plate and the mercury droplet of respective embodiments of FIGS. 5A to 5F and FIGS. 6A to 6F, have mechanically stable two states. Herein, mechanically stable two states refers to two states in which mechanical potential energy is small. For example, in FIGS. 5A-5F, the mechanically stable two states are, the state in which the metal plate C has upwardly convexed shape and is in contact with the metal plate A (FIG. 5A), and the state in which the metal plate C has a downwardly convexed shape and is in contact with the metal plate B (FIG. 5D). In FIGS. 6A-6F, the mechanically stable two states are, the state in which the mercury droplet is at rest at the gap between the metal plate A and the metal plate C (FIG. 6A), and the state in which the mercury droplet is at rest at the gap between the metal plate C and the metal plate B (FIG. 6D). The switching operation between the two states is carried out by causing the state to undergo transition between the mechanically stable two states by means of a certain external force (unillustrated) such as electromagnetic force produced by an electromagnetic field applied from outside. At this time, in FIGS. 5A-5F, the potential energy in the state of FIG. 5A has a minimum value; the potential energy has a maximum value in the middle of the deformation, which is caused by a certain external force, of the metal plate C; and the potential energy has a minimum value again when the metal plate C is further deformed and reaches the state of FIG. 5D. The state change from FIG. 5D to FIG. 5A is also performed in the same manner.

In FIGS. 6A-6F, the potential energy in the state of FIG. 6A has a minimum value, and the mercury droplet ME moves toward the metal plate B when a certain external force is applied. In a state taken during the movement (a state in which the mercury droplet ME is not in contact with the metal plate A and B, but in contact with the metal plate C), there exists a position in which the potential energy has a maximum value. When the mercury droplet ME is further moved toward the metal plate B and reaches the state of FIG. 6D, the potential energy again has a minimum value. The state change from FIG. 6D to FIG. 6A is also performed in the same manner.

As described above, either case of FIGS. 5A-5F and FIGS. 6A-6F has mechanically stable two states in which potential energy has a minimum value. In the stable states, the states are maintained, as they are, without applying external forces. Therefore, changed functions are maintained without circuits for maintaining states. As a result, there exhibited effects that increase of electric power consumption and the chip area are suppressed.

In FIG. 7 and FIGS. 8A-8F, there illustrated the means and method for practically performing controlling when the structure of FIGS. 5A-5F is employed.

In the structure of FIGS. 5A-5F, two stable states are provided and utilized as the two states of a switch, and means for switching the two states is required. A structure including the means is shown in FIG. 7 and FIGS. 8A-8F. FIG. 7 is a plan view; and FIGS. 8A-8F include diagrams showing the cross sections taken from X-X' and Y-Y' of FIG. 7, and the states as a switch. As shown in FIG. 7, the metal plate A and the metal plate C which are shown in FIGS. 5A-5F are provided. In FIG. 7, metal plates CG1 are provided in addition to the metal plate B which is disposed parallel to the metal plate A so that the metal plate C is sandwiched as shown in FIG. 5. As shown in FIG. 8B, which is a cross section taken from Y-Y', metal plates CG2 are disposed parallel to the metal plates CG1 so that the metal plate C is sandwiched. The distance "d2" between the metal plates CG1 and the metal plates CG2 which are parallel to each other, is larger than the distance d1 between the metal plate A and the metal plate B which are parallel to each other. Therefore, the metal plate C does not come into contact with the metal plates CG1 and the metal plates CG2, even when the metal plate C is in the two states, i.e., a state in which the plate C is in contact with the metal plate A in an upwardly convexed state (FIGS. 8A and 8B), or in contact with the metal plate B in a downwardly convexed state (FIGS. 8D and 8E).

By employing this structure, two states of the metal plate C are controlled by the metal plates CG1 and the metal plates CG2. For example, the electric potentials of the opposite polarity are imparted to the metal plates CG1 and the metal plate C, and that of the same polarity are imparted to the metal plates CG2 and the metal plate C. Hereby, by coulomb force, an attractive force is exerted between the metal plates CG1 and the metal plate C, and a repulsive force is exerted between the metal plates CG2 and the metal plate C. As a result, the metal plate C undergoes transition to an upwardly convexed stable state. Once the transition to an upwardly convexed state is completed, the metal plate C comes into contact with the metal plate A and halts at the position. Therefore, there attained a state in which the metal plate A and the metal plate C are electrically conducted, which is the state of FIG. 8C as a switch state. Conversely, the electric potentials of the same polarity are imparted to the metal plates CG1 and the metal plate C, and that of the opposite polarity are imparted to the metal plates CG2 and the metal plate C. Herein, a repulsive force is exerted between the metal plates CG1 and the metal plate C, and an attractive force is exerted between the metal plates CG2 and the metal plate C. As a result, the metal plate C undergoes transition to a downwardly convexed stable state, and comes into contact with the metal plate B and halts. Therefore, there attained a state in which the metal plate B and the metal plate C are electrically conducted, which is the state FIG. 8F as a switch state.

Before describing about a signal generating means for controlling the switch, a method for producing such bistable MEMS switch in a CMOS structure will be described.

Figure 9:
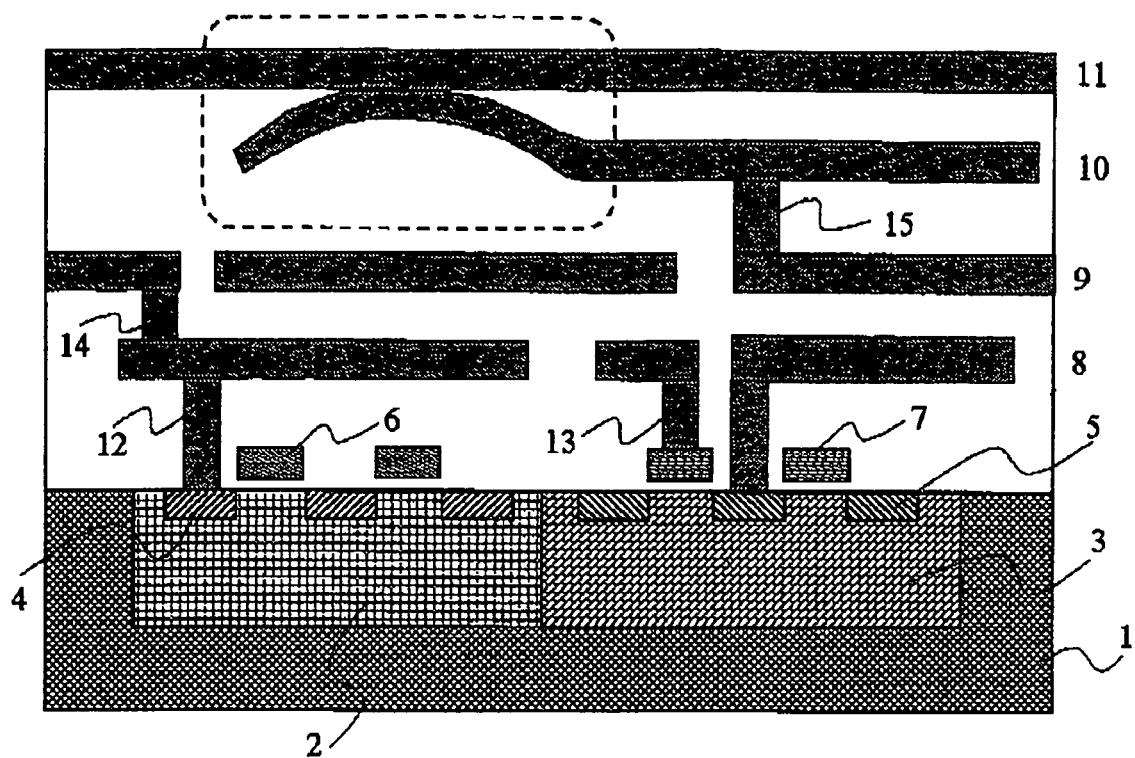
FIG. 9 is a diagram showing a configuration example of a bistable MEMS switch embedded with a CMOS.

FIG. 9 is a cross section of such bistable MEMS switch which is produced by utilizing a wiring layer in an upper part of a CMOS structure. The bistable MEMS switch is fabricated in the upper part of the CMOS logic element, therefore reduction of the area can be achieved. A semiconductor substrate is denoted by 1, 2 denotes a p-type well, 3 denotes an n-type well, 4 denotes a high-concentration n-type layer constituting a source or a drain of a MOS, 5 denotes a high-concentration p-type layer constituting a source or a drain of a MOS, 6 denotes a gate layer of the n-type MOS, 7 denotes a gate layer of the p-type MOS, 8 to 11 denote wiring layers, and 12 to 15 denote layers for connecting the wiring layers. In this embodiment, the metal plate C explained with FIGS. 5A-5F, FIG. 7, and FIGS. 8A-8F are constituted by use of the wiring layer 10.

Figure 10:
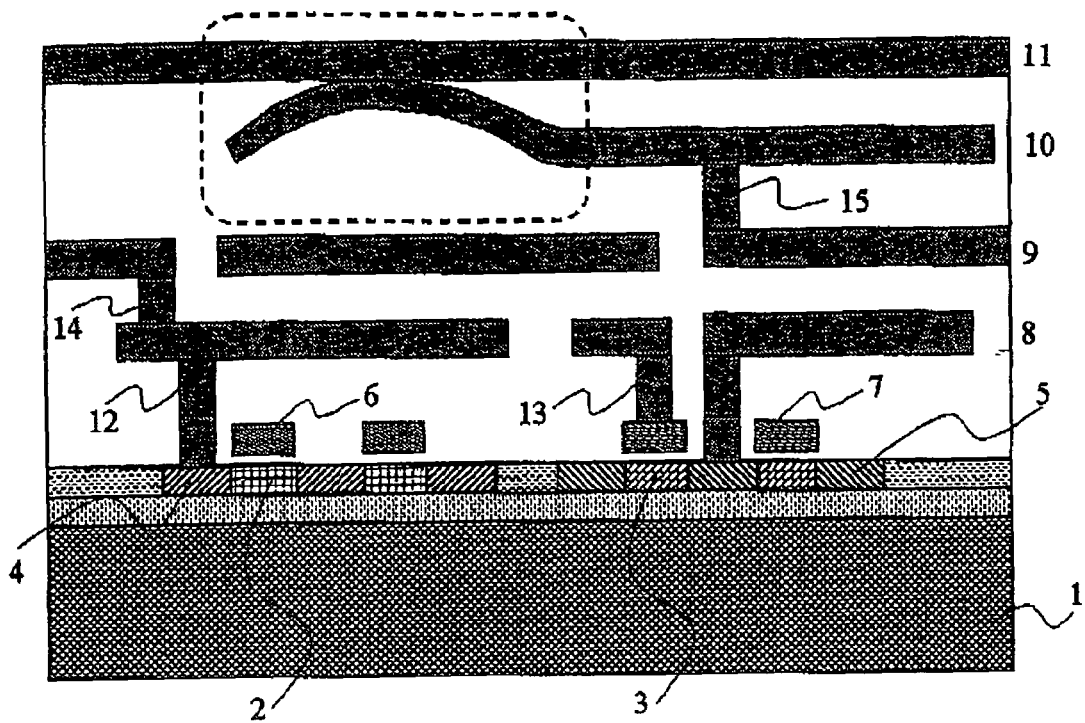
FIG. 10 is a diagram showing a configuration example of a bistable MEMS switch embedded with a CMOS having SOI structure.

FIG. 10 is a cross section of such bistable MEMS switch which is produced by utilizing a wiring layer in an upper part of a CMOS structure which includes an SOI structure. There realized a semiconductor device additionally having the characteristics of SOI, such as small parasitic capacitance, sub-threshold property excellence depending on structures, and small leakage current. The structural difference with FIG. 9 resides in that: an insulating layer 101 is formed on a semiconductor substrate 1; and a p-type layer 2, an n-type layer 3, a high-concentration n-type layer denoted by 4 comprising a source or a drain of a MOS, and a high-concentration p-type layer denoted by 5 comprising a source or a drain of a MOS; are formed on the insulating layer. Voltage may be applied to the semiconductor substrate 1.

Figure 11:
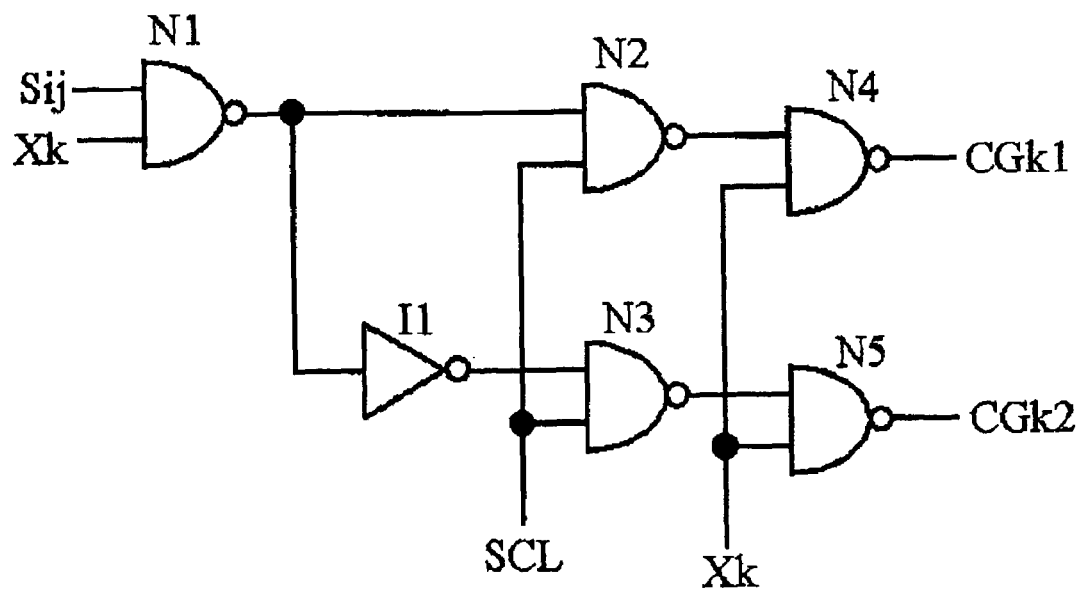
FIG. 11 is a diagram showing an example of a controlling circuit of a bistable MEMS switch.
Figure 12:
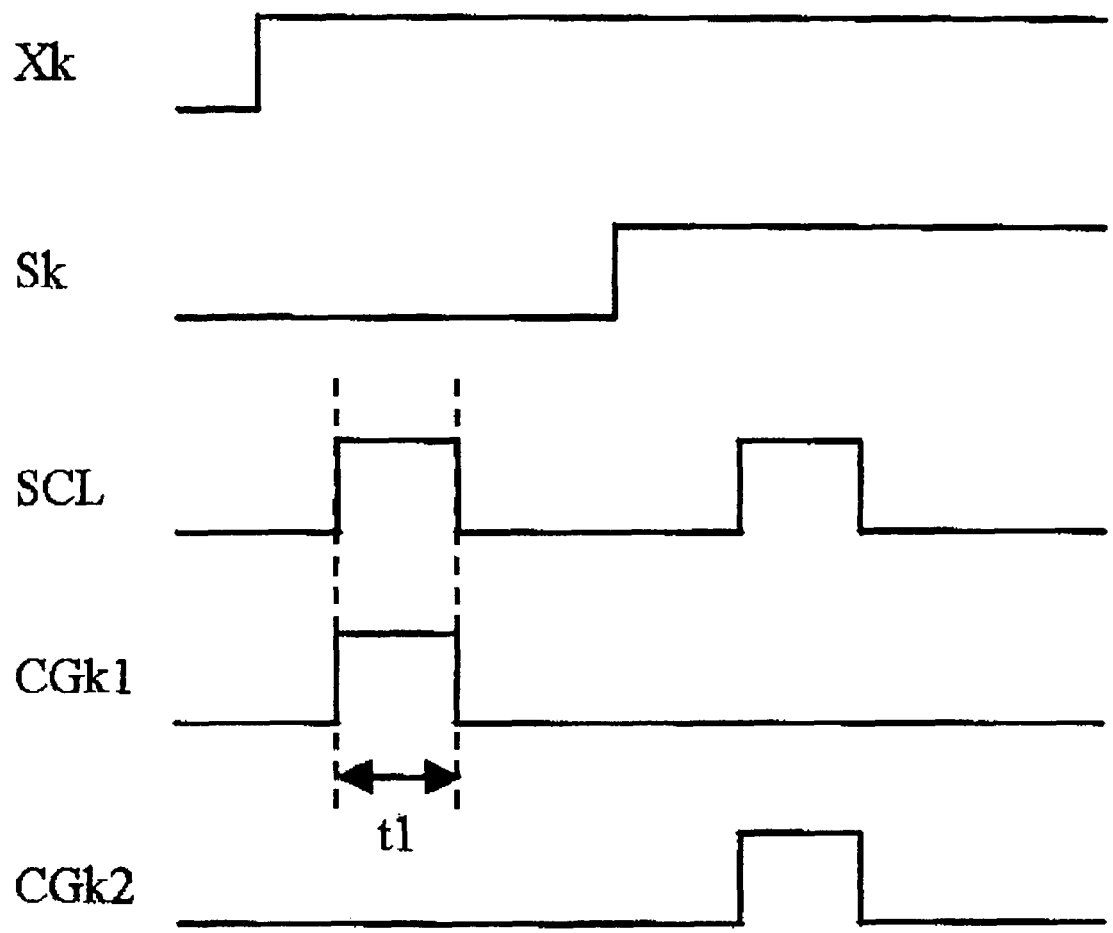
FIG. 12 is a diagram showing operation examples of the controlling circuit of a bistable MEMS switch.

Next, examples of a method for generating controlling signals are shown in FIG. 11. There essentially provided a function which determines to which one of CG1 and CG2 to apply a predetermined voltage, and a function which determines how long the predetermined voltage is applied. A signal S which selects either CG1 or CG2, selects CG1 at a low electric potential and CG2 at a high electric potential. A signal SCL regulates how long the voltage is to be applied. Herein, a number of bistable MEMS switches are provided, and a case in which kth switch is controlled is assumed. The selection signal thereof is Xk, and CG1 and CG2 of the kth switch are represented by CGk1 and CGk2, respectively. By employing a circuit, for example, that shown in FIG. 11, a desired controlling signal CGk1 or CGk2 is generated from a selection signal S of CG1 and CG2, a kth-selection signal Xk, and a voltage applying time determination signal SCL. In the diagram, N1 to N5 denote NAND elements, and I1 denotes an inverter element. The operation of the circuit will be explained by use of FIG. 12. When the aimed kth bistable MEMS switch is to be selected, Xk varies from a low level to a high level. Accordingly, the NAND element N1 in FIG. 11 attains a state in which an output varies depending on the signal S which selects either CGk1 or CGk2. Meanwhile, N4 and N5 attain a state in which they can output voltage corresponding to the internal state of the circuit, to CGk1 and CGk2. First, S has a low level. Therefore, the output of N2 is switched depending on the signal SCL which regulates the voltage applying time, while the output of N3 is fixed at a low level. Herein, CGk1 is selected. With this state, when SCL is varied from a low level to a high level only during the time t1, a high level is output to CGk1 during the corresponding time. As a result, C is switched to one stable state in the structure shown in FIG. 7 and FIGS. 8A-8F.

Next, a case in which S is switched and CGk2 is selected is described herein. When S is switched from a low level to a high level, the output of N2 is fixed to a low level, while the output of N3 is switched depending on the signal SCL which regulates the voltage applying time. That is, CGk2 is selected. When SCL is varied from a low level to a high level only during a time t1, a high level is output to CGk2 during the corresponding time. As a result, C of FIG. 7 and FIGS. 8A-8F is switched to another stable state.

The relation between the operation voltage of such controlling circuit and the operation voltage of a circuit including a bistable MEMS switch which is operated by such controlling circuit, will be described.

Figures 13A, 13B:
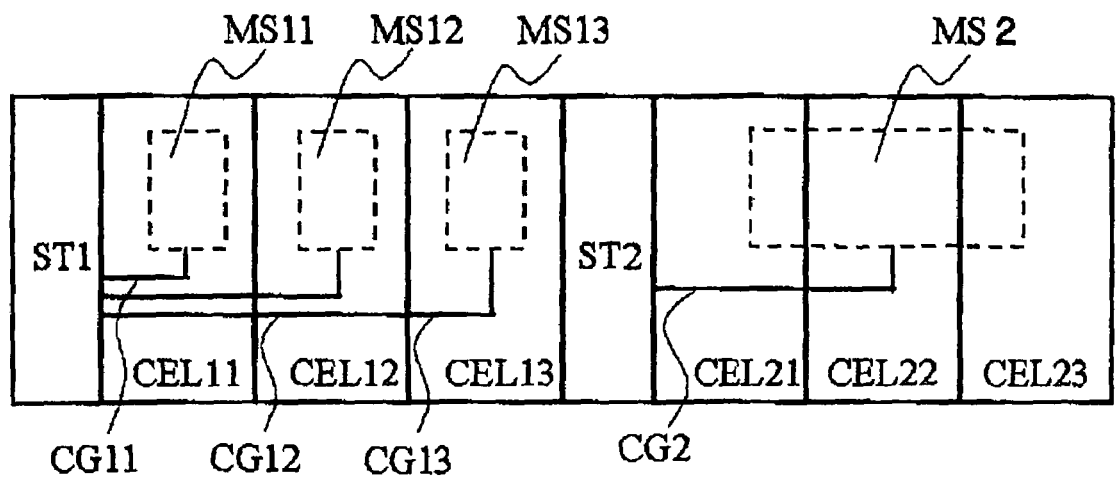
FIGS. 13A and 13B include diagrams showing an arrangement of circuits including bistable MEMS switches, and controlling circuits thereof.

FIG. 13A shows a layout region, and CEL11 is a circuit block, for example, like a circuit shown in FIG. 3, including a bistable MEMS switch MS11. Similarly, CEL12 and CEL13 are circuits including MS12 and MS13, respectively. A circuit which generates signals for controlling MS11 to MS13 is denoted by ST1. The output signals from ST1 to CEL11, CEL12, and CEL13 are denoted by CG1, CG2, and CG3, respectively. Similarly, CEL21 to CEL23 are circuit blocks. However, in this example, the region of the bistable MEMS switch MS2 spreads over plural circuit blocks. Herein, the function switched by MS may be that of any one of CEL21 to CEL23, or may be that of all of CEL21 to CEL23. A controlling circuit of MS2 is ST2, and a controlling signal is CG2. In this structure, the operation voltage of ST1 and ST2 are different from the operation voltage of CEL11 to CEL13, and CEL21 to CEL23; because ST1 and ST2 are comprised of CMOS, and the states of bistable MEMS switches have to be changed by the output signals of ST1 and ST2.

Meanwhile, the logic operation of CEL11 to CEL13 and CEL21 to CEL23 is a common CMOS logic operation, although the circuits constituting them includes MEMS switches in their current pathways. Therefore, the circuits of two kinds have different voltages for operating the circuits. An example is shown in FIG. 13B. A CMOS circuit, for example, ST1, which generates controlling signals is operated at, for example, 2.5 V. A CMOS logic circuit, for example, CEL11, which includes a MEMS switch is operated at, for example, 0.9 V. Herein, the structure of CMOS composing the circuits may be changed in accordance with voltage differences. Herein, thickness of an insulating film is shown as an example. Other examples include the difference of the length of gates, the difference of threshold voltages, and the difference of the impurity densities in diffusion layers, which is accompanied with the above described differences. Corresponding to the different operation voltages of a circuit of ST1 and a circuit of CEL11, the film thickness of insulating films of CMOS which composing the circuits, is varied. For example, an insulating film of 7 nm is employed in the circuit ST1 which is operated at high voltage, and an insulating film of 1.8 nm is employed in the circuit CEL11 which is operated at a low voltage. ST1 outputs plural controlling signals CG11, CG12, and CG13, and input them to the plural circuit CEL11, CEL12, and CEL13 which are operated at a lower voltage. Accordingly, regions having insulating films of different thicknesses can be separately disposed.

Consequently, the production is simplified. An LSI having high reliability is realized by separately employing CMOS having insulating films which has two different thicknesses in a manner described above. For example, the voltage employed for an input/output circuit may be employed as the above described high voltage, in the example of the diagram, 2.5 V. Generally, an LSI has an independent power supply pin for input and output, to which a voltage which is higher than that for CMOS logic circuits in the LSI is applied. The reason for this is that, the changing pace of the standards of interfaces to which lines for transmitting signals with LSIs are connected, is slow for LSIs in which, generally, voltage decrease is progressed in accordance with the progress of generation and time.

For separately employing the two types of CMOS, the used regions may be further divided, so as to reduce the area or attain stabilized operations. Such example is shown in FIG. 14. In the diagram, CEL31 to CEL53 which are operated at a low voltage are collectively arranged in a matrix, and controlling circuits ST3 and ST4 are disposed on the two sides of the matrix arrangement. In this arrangement, for example, controlling of CEL42 from ST3 and ST4, is enabled by a simple wiring arrangement. Accordingly, further complicated controlling is enabled with a structure having a small area.

In addition to the foregoing, important parts of mechanisms for switching further complicated functions will be disclosed in order below, based on the matters obtained for the first time by our studies.

Figure 15A:
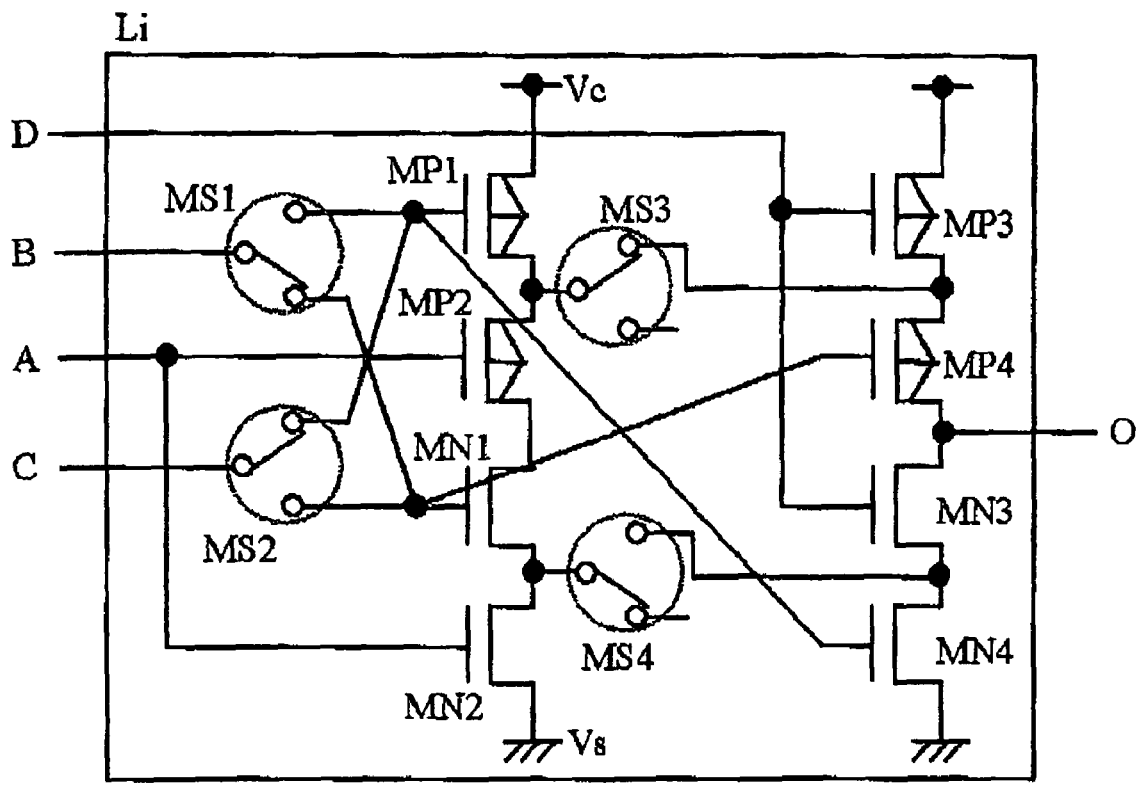
FIGS. 15A and 15B include diagrams illustrating a function of a third embodiment of the present invention.
Figure 15B:
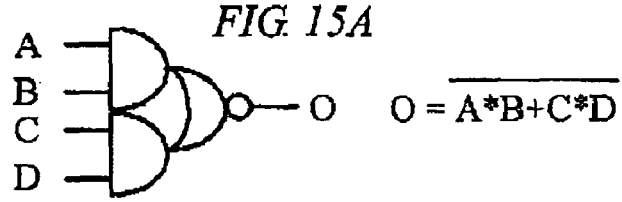
Figure 16A:
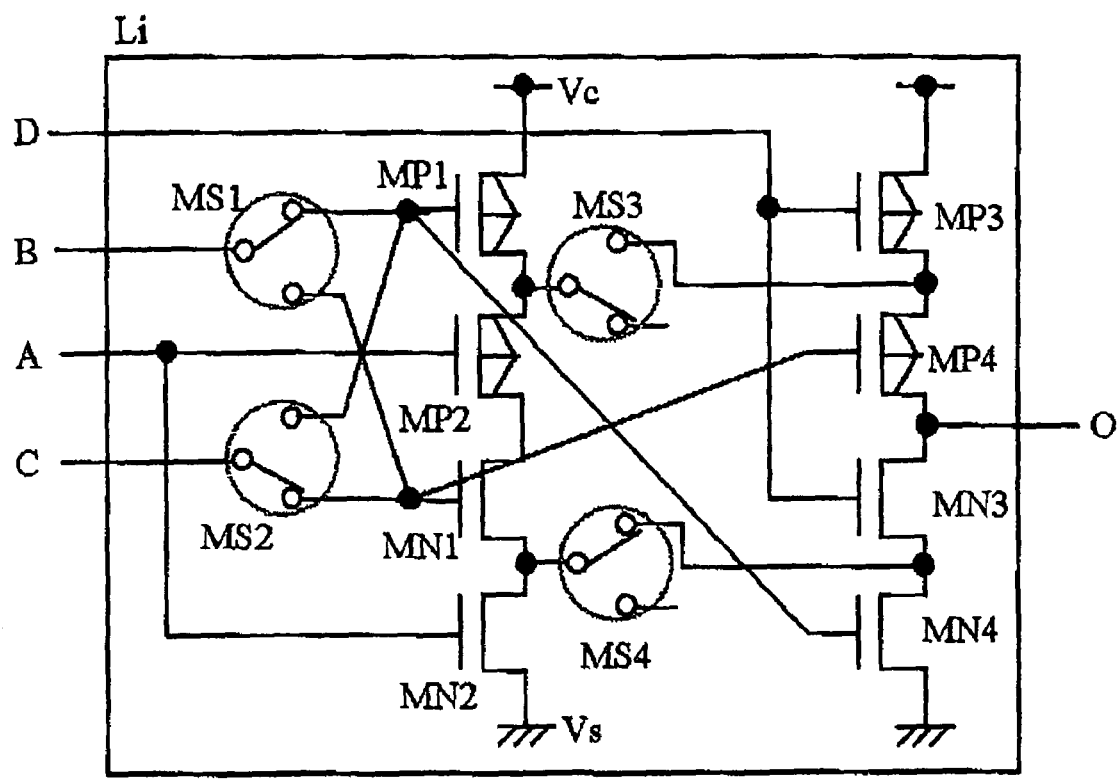
FIGS. 16A and 16B include diagrams illustrating another function of the third embodiment of the present invention.
Figure 16B:
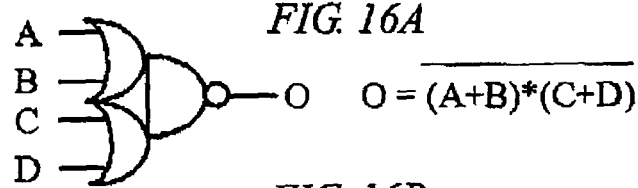

FIG. 15 and FIG. 16 shows a circuit for switching a four-input composite gate. The circuit is realized by switching bistable MEMS switches in one circuit, to a logic which carries out ANDing both of the two pairs of inputs out of the four inputs, and ORing the two results; or to a logic which carries out ORing both of the two pairs of inputs first, and ANDing the two results. ANDing and ORing are fundamentals of logic operations, and when these are subsequently carried out, operations are composed by the combinations of those, which one is to be the first and which one is to be the next. Therefore, the advantage of capability of arbitrary changing of the orders is great. In FIG. 15, MP1 to MP4 denote pMOS transistors, MN1 to MN4 denote nMOS transistors, and MS1 to MS4 denote bistable MEMS switches. The controlling signals of bistable MEMS switches explained in FIG. 7 and FIGS. 8A-8F are omitted. The wire connections between the elements are identical in FIG. 15 and FIG. 16. When MS1 to MS4 are switched as shown in FIG. 15, the output O corresponding to four input A, B, C, and D becomes the inversion signal of A*B+C*D (see FIG. 15B, inversion is represented by a bar on top of the formula in accordance with the general rule). On the other hand, when MS1 to MS4 are switched as shown in FIG. 16, the output O becomes the inversion signal of (A+B)*(C+D) (see FIG. 16B). As described above, the function of the circuit block Li can be switched by bistable MEMS switches.

FIG. 17 is a diagram showing an example of an AND/OR circuit which is another example of the above described circuit block Li. A circuit block Li has an AND plane and an OR plane. General logic operations are performed, by use of AND circuits which perform product operations and OR circuits which perform addition operations, with a plurality of inputs; and by determining with which signals to perform AND operations, and with which resultant signals to perform OR operations. Therefore, for example, in a case wherein four inputs and four outputs are provided, arbitrary combinations of operations are realized by preparing a circuit shown in FIG. 17. That is, in the example of the diagram, a bistable MEMS switch array in the AND plane selects to which signals of the input A, B, C and D to perform AND operations. The resultant signals are input to the OR plane, and another bistable MEMS switch array also selects to which signals, among the input signals, to perform OR operations. The results F1 to F4 are obtained by performing desired product/addition operations with the inputs A, B, C, and D.

FIGS. 18A and 18B show an example of the switch array employed in FIG. 17. A switch cell S11 illustrated in FIG. 18A by use of the symbol employed in FIG. 17, is a switch which is able to selectively separate a vertical signal wiring CN1 and horizontal signal wiring RN1. The representation of the switch cell by a switch symbol is as shown in FIG. 18B. The switch is comprised by the above described bistable MEMS switch. In the example of FIG. 18, the switches are arranged in n number of columns, CN1 to CNn; and m number of lines, RN1 to RNm. With this structure, arbitrary one of CN1 to CNn can be connected with arbitrary one of RN1 to RNm.

Figure 19A:
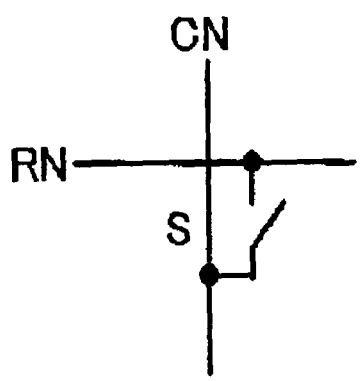
FIGS. 19A to 19D includes diagrams showing operation examples of a bistable MEMS switch which is employed as a switch of a switch array.
Figure 19B:
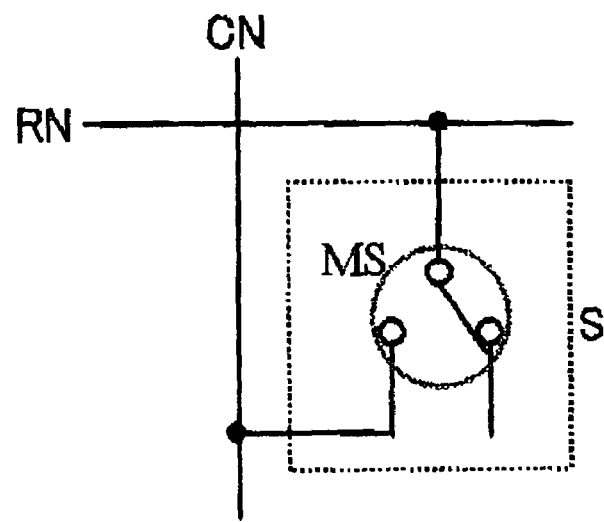
Figure 19C:
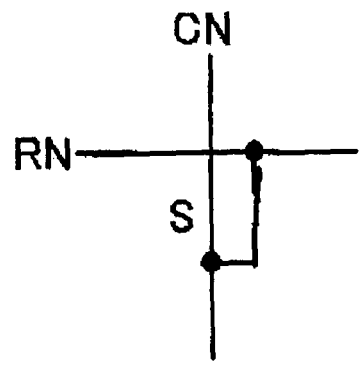
Figure 19D:
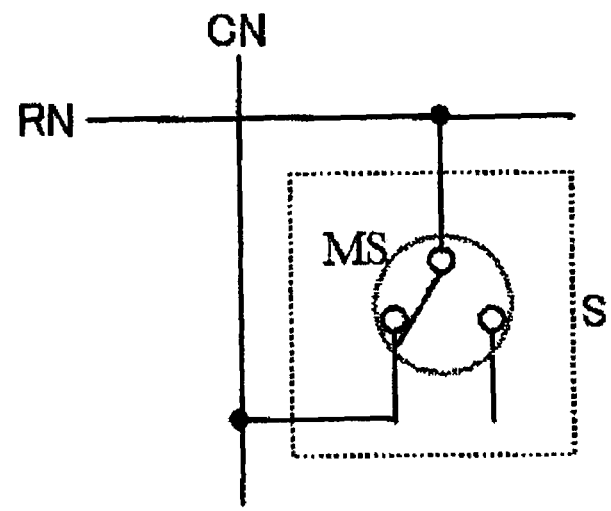

The states of the switch are shown in FIGS. 19A and 19B. In FIGS. 19A and 19B, CN represent any one of CN1 to CNn of FIGS. 18A and 18B, and RN correspond to any one of RN1 to RNm. The state in which the switch is open, i.e., CN and RN are separated as shown in FIG. 19A, is the state of a switch cell S which has a bistable MEMS switch MS as shown in FIG. 19B. Meanwhile, the state in which the switch is closed, i.e., CN and RN are connected as shown in FIG. 19C, is the state of the switch cell S which has a bistable MEMS switch MS as shown in FIG. 19D. As described above, a switch which is able to selectively connect or separate the vertical signal wiring CN and the horizontal signal wiring RN, can be composed by a bistable MEMS switch. When the switch array, such as that shown in FIG. 18, is composed with such switches; an AND/OR circuit, such as that shown in FIG. 17, in which internal functions can be changed can be composed. Herein, the already explained functions and means for switching the bistable MEMS switch are omitted.

Figure 20:
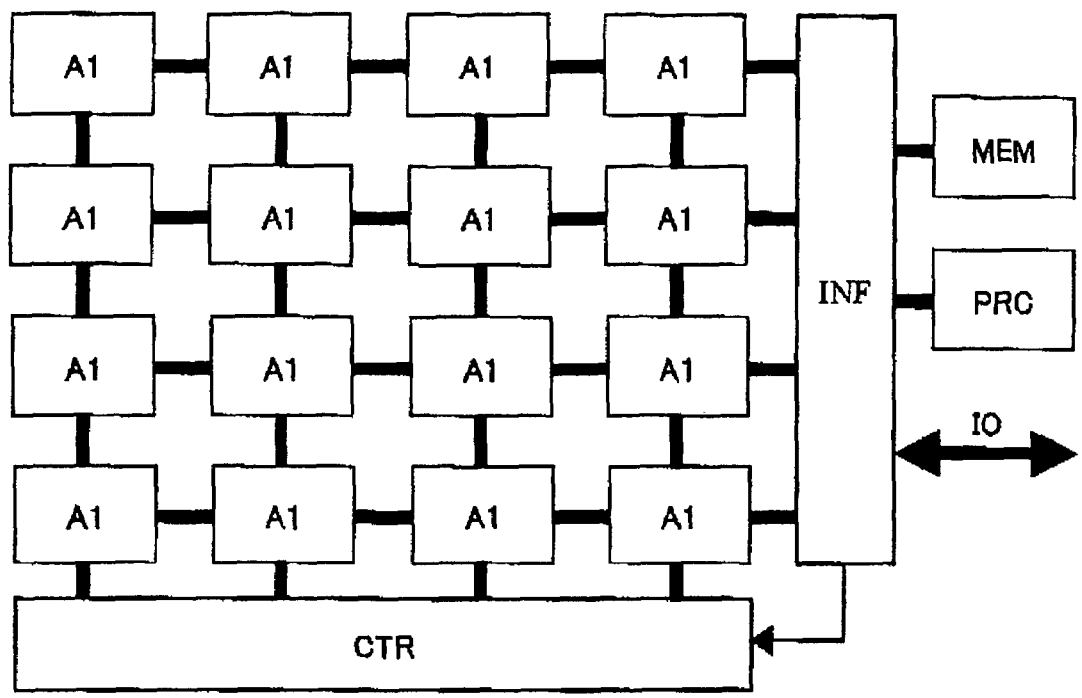
FIG. 20 is a diagram showing a fifth embodiment of the present invention.

By arranging such circuits Li in a matrix, further advanced switchable functions can be realized. The example is shown in FIG. 20. In the diagram, A1 denotes a circuit block, in which functions are switched by bistable MEMS switches, and A1 is comprised of above described Li itself or its plural combinations. CTR denotes a circuit for controlling bistable MEMS switches in the circuit blocks, INF denotes an input/output circuit of operation results of A1, MEM denotes a memory, PRC denotes a processor which integrates the entirety while performing operations by itself, and IO denotes a bus for external input and output. Memory MEM may be connected to INF and used by every A1 by being shared, or another method may be taken, i.e., the memory may be dividedly disposed in each A1. According to the present embodiment, the connection manner and functions of A1 can be changed in accordance with the data and command from IO. In addition, there exhibited effects in that, when a large scale circuit (a composite variable logic gate array) is composed by a combination of circuit blocks including at least one block; a semiconductor device exhibiting high degree of freedom for changing functions, high-speed, and having small area, is realized.

Figure 21:
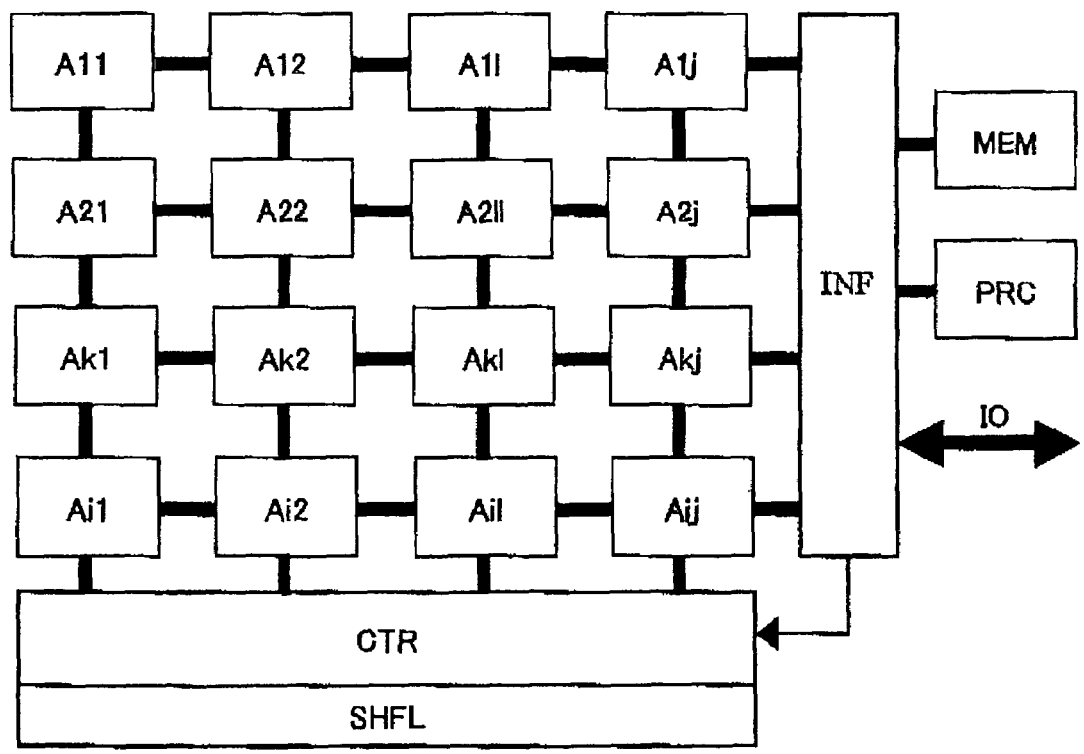
FIG. 21 is a diagram showing a sixth embodiment of the present invention.

FIG. 21 shows an embodiment in which switchable circuits are arranged in an matrix in the same manner and advanced functions are switchable. The difference with FIG. 20 resides in that each of the circuit blocks composing the matrix may have different circuit constitutions, and that a circuit denoted by SHFL which internally performs switching of circuit functions is additionally provided. Since each of the circuit blocks has different circuit constitution, A11 to Aij shown in the diagram denote circuit blocks having different circuit constitutions, and functions thereof and connection manner between them are controlled by CTR. Means for switching them is brought about by use of bistable MEMS switches. According to the present embodiment, functions of each of the circuits can be switched, and connection manner thereof can be switched. Therefore, there exhibited an effect that further advanced functions are switchable. In addition, there exhibited effects in that, when a large scale circuit (a composite variable logic gate array) is composed by a combination of circuit blocks including at least one block; a semiconductor device exhibiting high degree of freedom for changing functions, high-speed, and having small area, is realized.

Figure 22A:
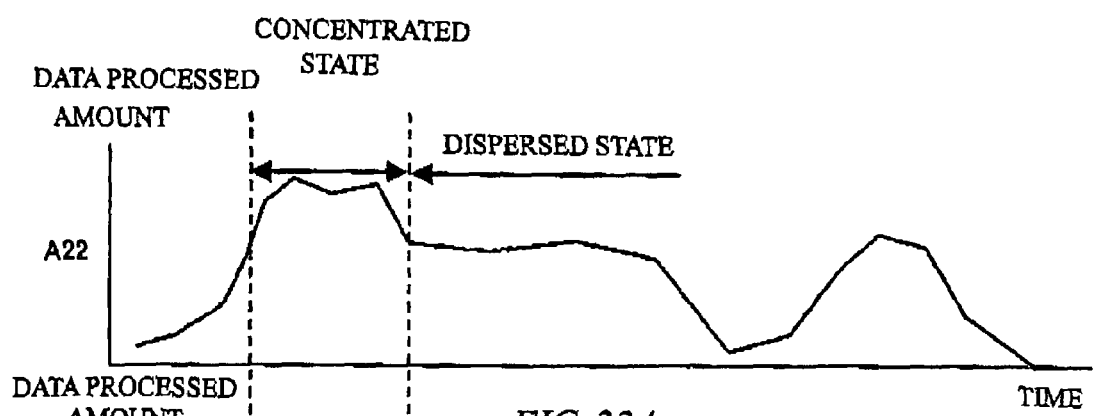
FIGS. 22A to 22C includes diagrams showing an operation example of the sixth embodiment of the present invention.
Figure 22B:
Figure 22C:
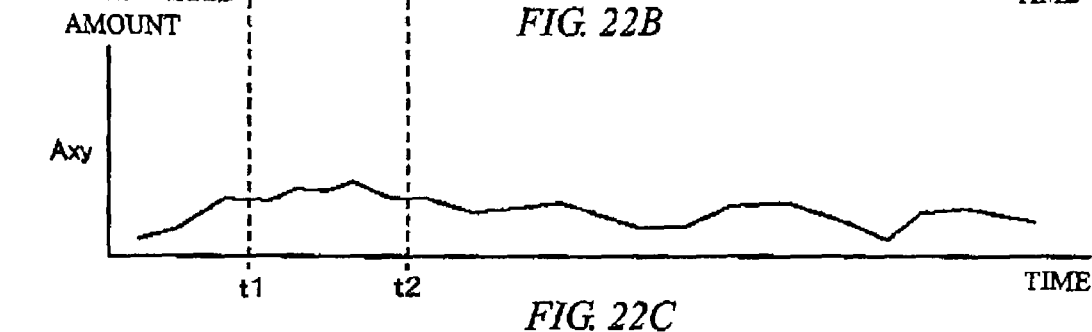

Next, functions of SHFL will be described by use of FIGS. 22A-22C. In the diagram, changes of the amount of processed data in accordance with time in circuits A22, Aab, and Axy, are schematically shown. In this example, only A22 has a large amount of processed data during the time t1 to t2, however, in others, Aab and Axy, the amount of processing is small in comparison with that. The processes are concentrated in A22. At this time, in A22, the consumption of electric power is large, heat is greatly generated, and processable amount may be surpassed, When this state is continued, the entire process is deteriorated. Meanwhile, once such state is attained, the state is apt to continue. In order to avoid this, SHFL is provided. SHFL monitors the amount of the current in each of the circuit blocks, and degree of activity of the circuit blocks based on the amount of data; and restructures the functions when excess amount of processes are imposed on A22. This may be realized simply by allotting half of the processes to other circuit blocks, and additionally providing a function for integrating those processes in other blocks or in the circuit block of interest. By carrying out this, the amount of process is dispersed after t2 in the example of FIG. 22.

FIG. 23 to FIG. 28 are diagrams showing examples in which the semiconductor devices of the present invention are applied to cellular automata. Cellular automata is defined as a constitution in which cells each of which having functions as an automaton (a state machine) are arranged in a matrix, and each cell is able to communicate only with adjacent ones.

Figure 23:
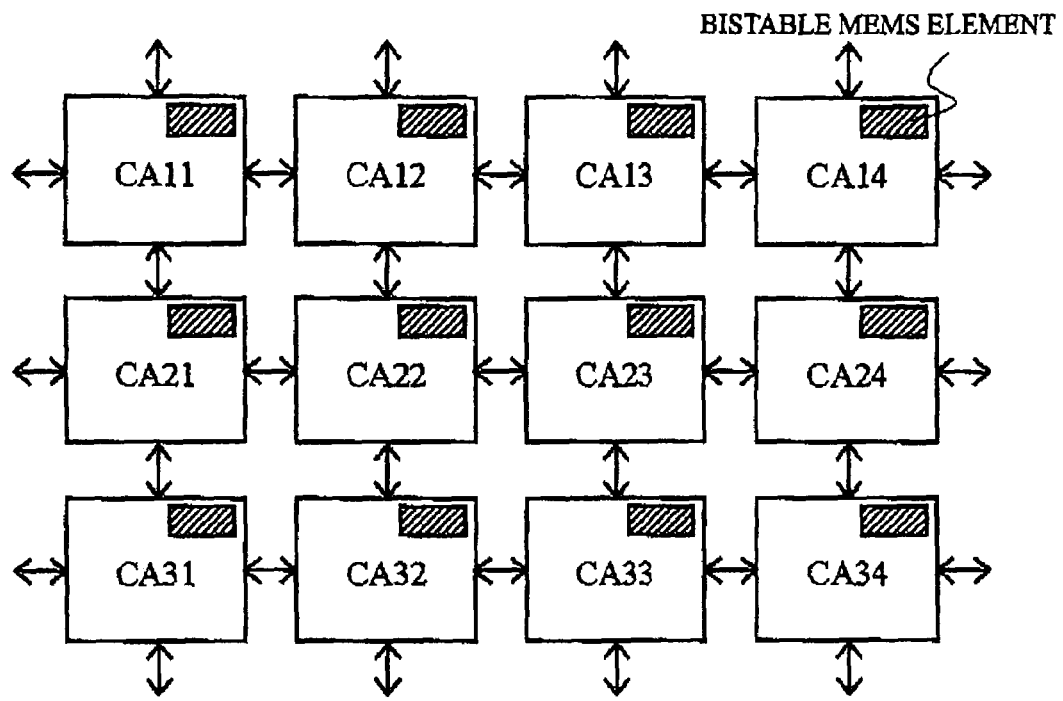
FIG. 23 is a diagram showing a seventh embodiment of the present invention.

FIG. 23 shows a system in which circuit blocks CA11 to CA34 are arranged in a matrix, and each of the circuit blocks is connected only with adjacent circuit blocks. Herein, each circuit block corresponds to a cell of the cellular automaton. For example, CA22 is connected only with CA12, CA21, CA23, and CA32. In such system, a high speed LSI which realizes many functions is produced, by providing a bistable MEMS element in each circuit block and changing functions. The constituting manner of the circuit block will be described below.

Figure 24:
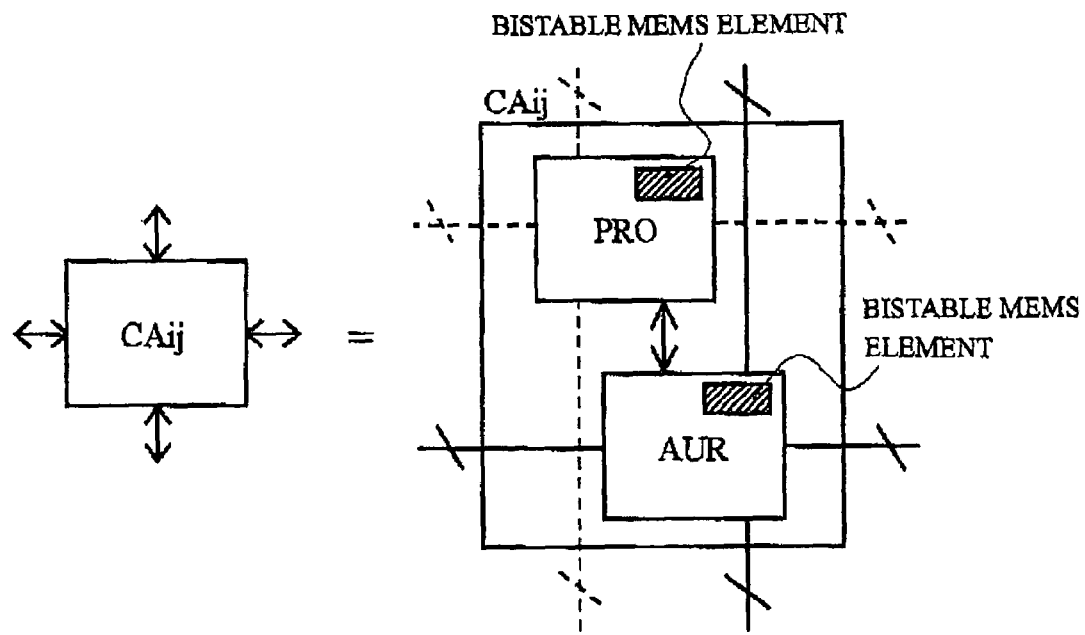
FIG. 24 includes diagrams showing a configuration example of a block unit employed in the seventh embodiment of the present invention.

CA11 to CA34 of FIG. 23 are represented by CAij, and an constitution example of CAij is as shown in FIG. 24. CAij consists of a circuit block PRO which is in charge of signal processing, and a circuit block AUR which performs controlling, for example, monitoring progress in a case in which data is mutually transmitted with other blocks, for example, when one job is divided, by communicating with those other circuit blocks CAij. Bistable MEMS elements are provided in above described PRO and AUR so as to make functions changeable. PRO and AUR are connected to PRO and AUR in other adjacent four circuit blocks, respectively. PRO is a circuit block which mainly performs signal processing, having constitution, for example, that shown in FIG. 2, FIG. 15, or FIG. 20. AUR will be described in more detail below.

Figure 25:
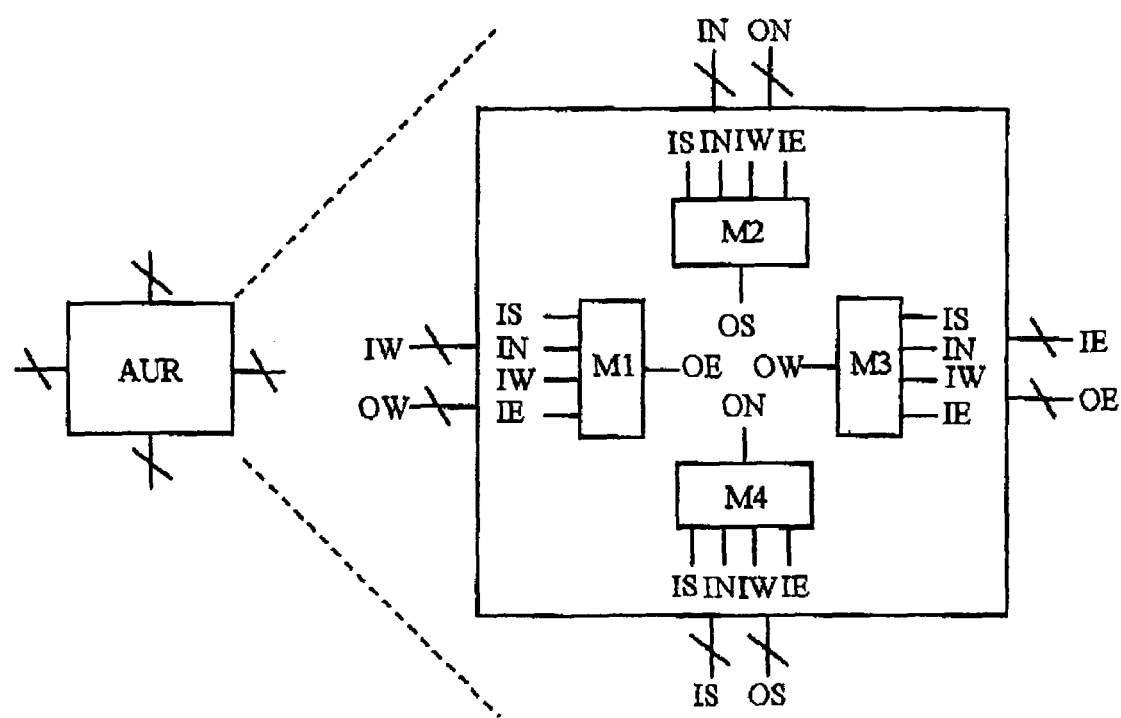
FIG. 25 is a diagram showing a configuration example which is subordinate in the unit block employed in the seventh embodiment of the present invention.

FIG. 25 is a diagram showing a configuration example of AUR. AUR has four inputs and outputs for the connection with other four adjacent circuit blocks. In the diagram, inputs are denoted by IN, IE, IS, and IW, and outputs are denoted by ON, OE, OS, and OW. The internal constitution of AUR comprises circuits M1, M2, M3, and M4 which output outputs ON, OE, OS, and OW, and inputs IN, IE, IS, IW are input to each circuit. That is, each output is produced by operating all inputs. For example, an output OS is produced from four inputs IN, IE, IS, and IW, by the circuit M2. By employing such symmetric constitution, operations having high degree of freedom can be performed.

Figure 26:
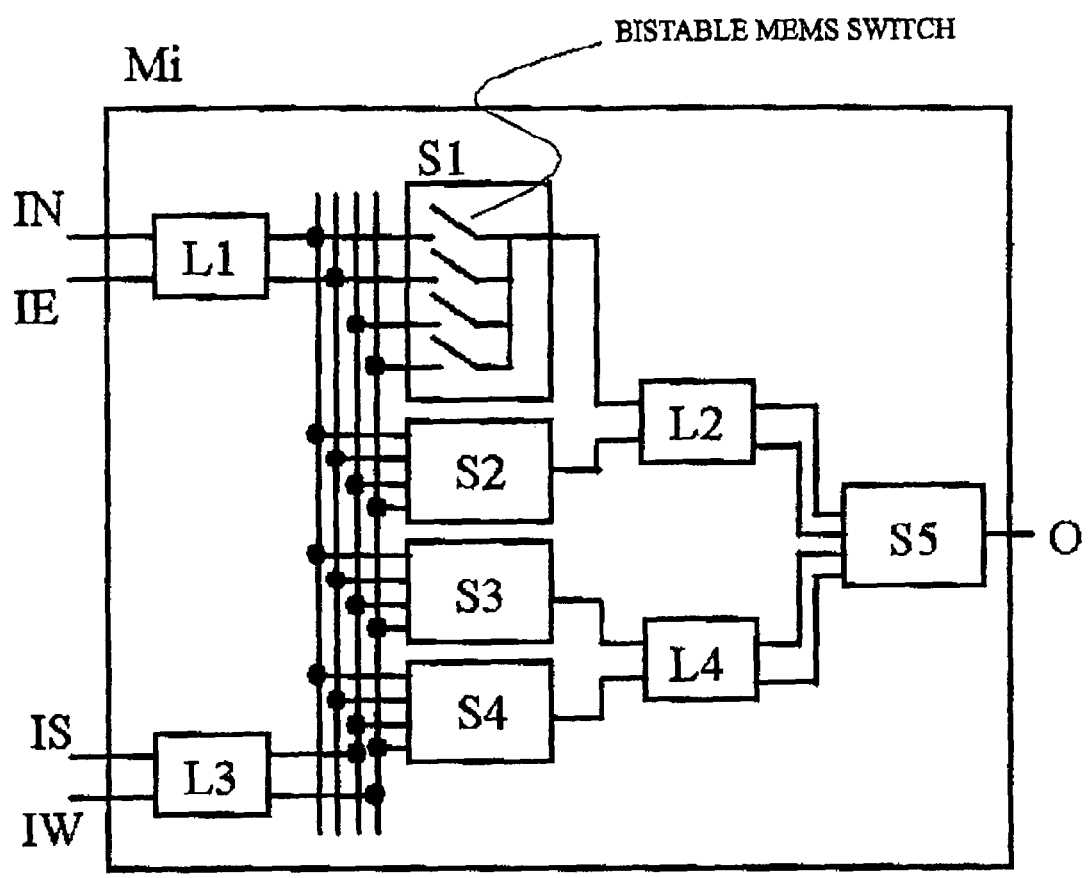
FIG. 26 is a diagram showing a configuration example which is further subordinate in the unit block employed in the seventh embodiment of the present invention.

Next, a constitution example of the circuits M1, M2, M3, and M4 is shown in FIG. 26 as Mi. In this example, Mi is constituted by circuits L1 to L4, and bistable MEMS switches denoted by S1 to S5. Each one of S1 to S5 has a function in which an input, for example one among those input to S1, is connected to the output by bistable MEMS switches as shown in S1. Inputs IN and IE are input to L1, and IS and IW are input to L3. The outputs of L1 and L3 are selectively connected to L2 and L4 by bistable MEMS switches S1 to S4. The outputs of L2 and L4 are, again, selectively connected by a bistable MEMS switch S5 so as to be output as O. O represents any one of outputs ON, OE, OS, and OW shown in FIG. 25. Accordingly, a signal of the output O can be generated from the inputs IN, IE, IS, and IW by a circuit which can change functions by use of bistable MEMS switches.

Figure 27:
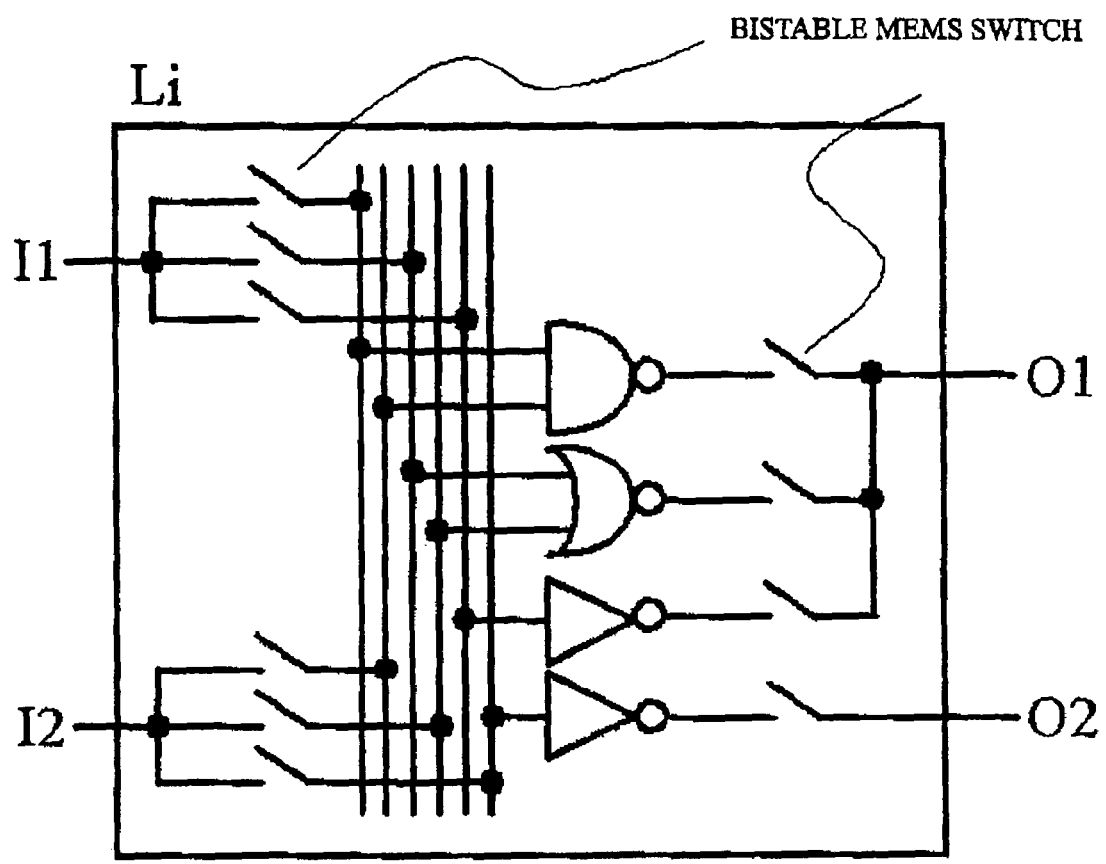
FIG. 27 is a diagram showing a configuration example which is further subordinate in the unit block employed in the seventh embodiment of the present invention.

Next, a constitution example of the circuits L1 to L4 is shown as Li in FIG. 27. The example of the diagram is a circuit which is able to select AND, NAND, or NOT of two inputs. The switching is performed by bistable MEMS switches.

Figure 28:
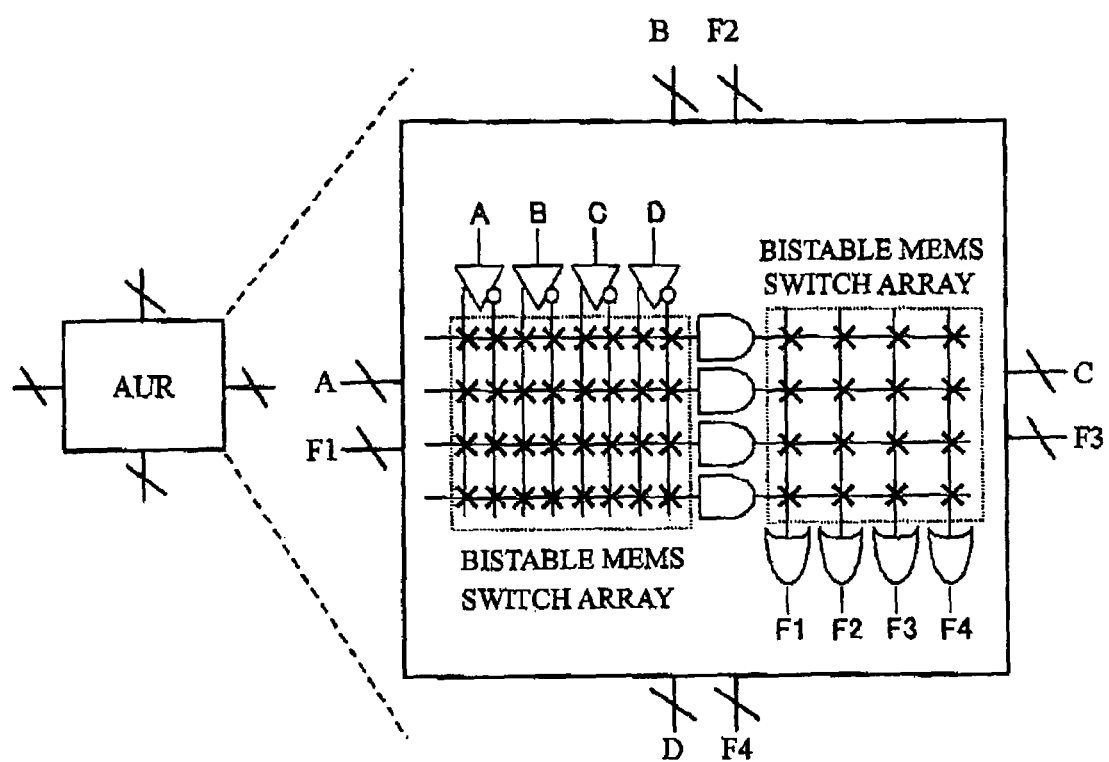
FIG. 28 is a diagram showing another configuration example which is subordinate in the unit block employed in the seventh embodiment of the present invention.

FIG. 28 is a diagram showing an example in which AUR is constituted by employing an AND plane and an OR plane. AUR has an AND plane and an OR plane. Similar to the example of FIG. 17, for example, in a case wherein four inputs and four outputs are provided, arbitrary combinations of operations are realized by providing a circuit shown in FIG. 28. That is, in the example of the diagram, a bistable MEMS switch array in the AND plane selects to which signals of the input A, B, C and D to perform AND operations. The resultant signals are input to the OR plane, and another bistable MEMS switch array also selects to which signals, among the input signals, to perform OR operations. The results F1, F2, F3, and F4 are obtained by performing desired product/addition operations with the inputs A, B, C, and D. In the present embodiment, an AUR which performs operations of, particularly, four inputs and four outputs is explained. However, the present invention is not limited to this. When number of the input gates and output gates is n, the number may be increased or decreased, such that AUR is configured to have, wide range of, plural inputs and plural outputs (n-inputs/n-outputs).

An example of a system which is constituted as so-called cellular automata in which circuit blocks are arranged in a matrix, and each circuit block is connected only with adjacent circuit blocks; is described above. The system can be constituted only by the circuit blocks, each of which connected only with adjacent circuit blocks, therefore, a very large system can be easily constituted. The functions in the system can be changed by, as described later with FIG. 35 to FIG. 38, a program, a command from outside, data itself from outside, or a program or command which are internally generated based on the difference between a desired output data and the data from outside.

Figure 29:
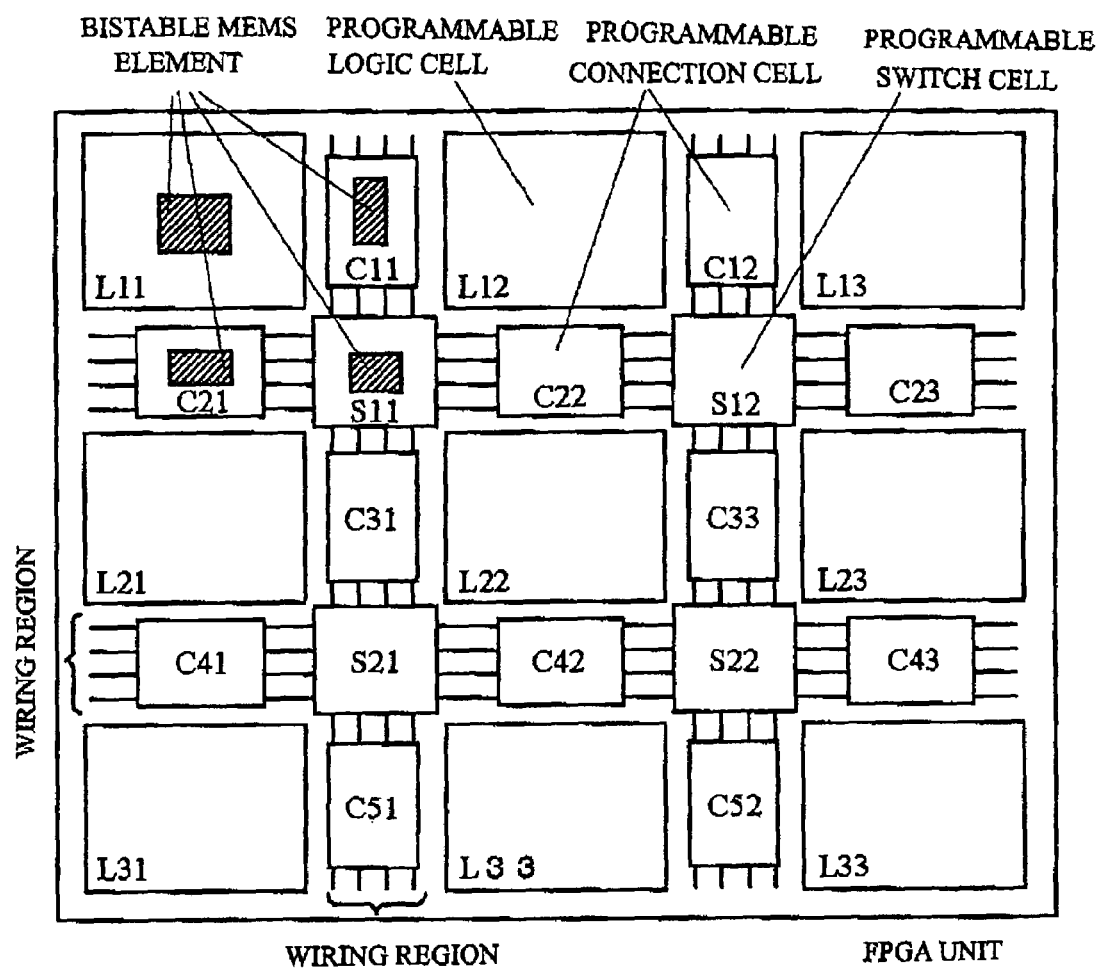
FIG. 29 is a diagram showing an eighth embodiment of the present invention.

FIG. 29 shows an example in which the idea and bistable MEMS switch elements of the present invention are applied in a FPGA unit. The FPGA unit is constituted by arranging plural logic cells L11 to L33, connection cells C11 to C52, and switch cells S11 to S22, in a matrix. The bistable MEMS switch element is provided in each one of the logic cell L11 to L33, the connection cells C11 to C52, and the switch cells S11 to S22, and desirable functions are configurable in accordance with the state of the switch elements. For example, in the logic cell L11 to L33, logic functions such as NOR and NAND are made changeable by the bistable MEMS switch elements. In the connection cells C11 to C52, the connections with corresponding logic cells L11 to L33 and wirings are made changeable by the bistable MEMS switch elements. In the switch cells S11 to S22, the connections with wirings are made changeable by bistable MEMS switch elements. Conventionally, the connections with wirings are made changeable by switches constituted by non-volatile memories and MOS circuits, therefore, there has been a problem that operation speed is lowered because of the large MOS resistance of the switch constituted by a MOS circuit. However, according to the present embodiment, MEMS elements which operates faster than MOS circuits are employed, instead of MOS circuits, for constituting a switch. Therefore, there exhibited a effect in that, a problem of such lowering of operation speed is solved.

Figure 30:
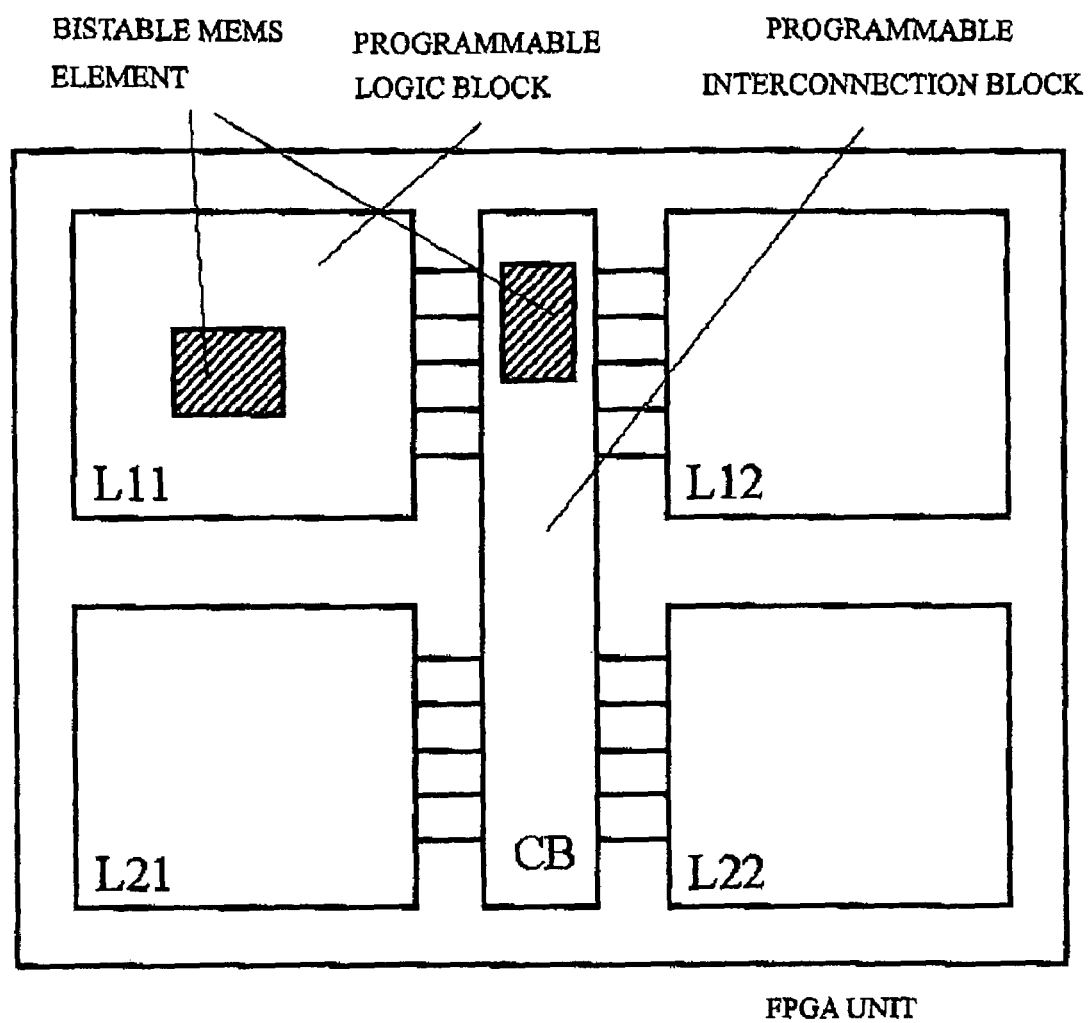
FIG. 30 is a diagram showing a ninth embodiment of the present invention.

FIG. 30 shows another example of the above described FPGA unit. The FPGA unit has logic blocks L11 to L22, and an interconnection block CB. The above described bistable MEMS switch elements are provided in each one of the logic blocks L11 to L22 and the interconnection wiring block CB, and desirable functions are configurable in accordance with the state of the switch elements. For example, logic functions such as that of a register and a computing unit, of logic blocks L11 to L22 are configurable. The interconnection block CB can switch interconnections between the function circuit which are configured at the logic blocks L11 to L22. This constitution corresponds to a constitution which is generally called CPLD (Complicated Programmable Logic Device). According to the present embodiment, wirings are concentrated at the periphery of the switchable interconnection wiring block, therefore, there exhibited an effect that wiring delay is small and approximately constant.

Figure 31:
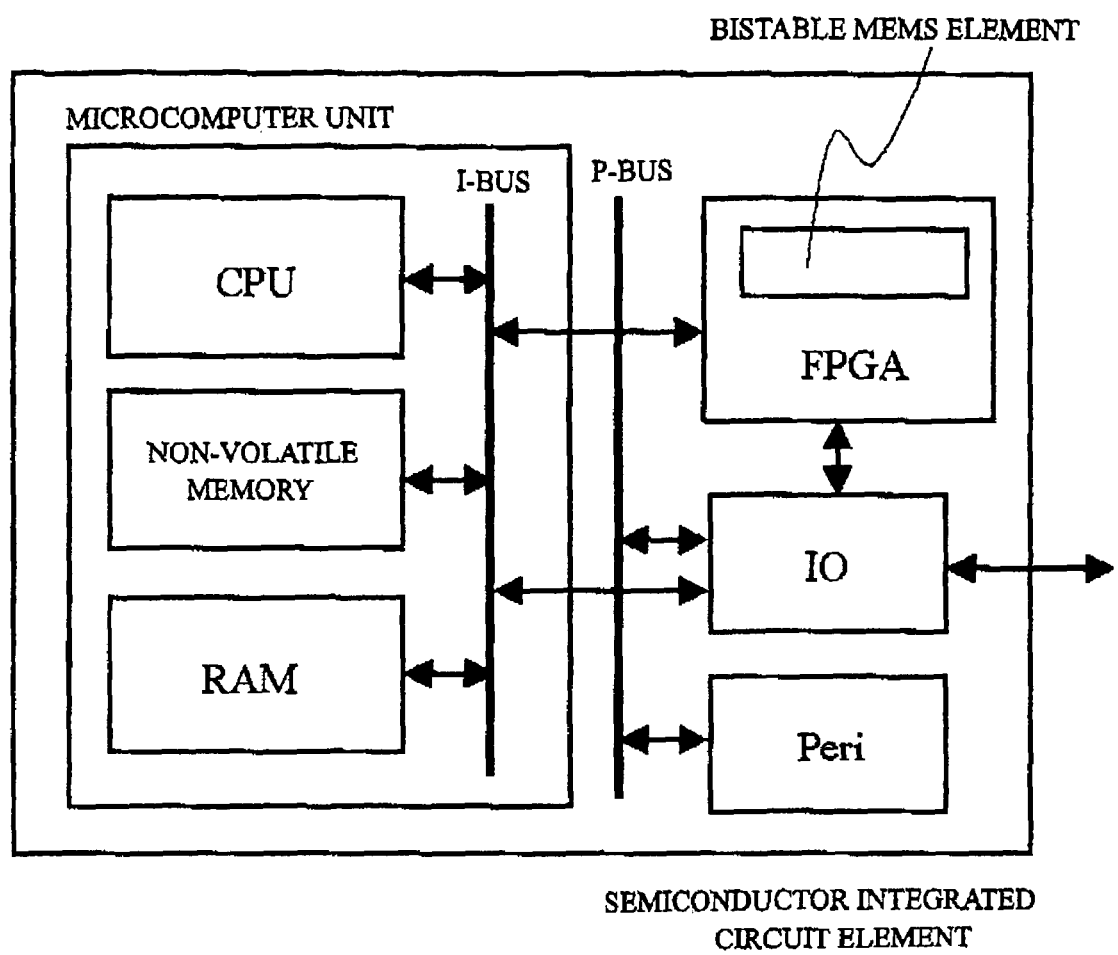
FIG. 31 is a diagram showing a tenth embodiment of the present invention.

FIG. 31 shows an example of a semiconductor integrated circuit of the present invention employing FPGA which employs bistable MEMS switch elements such as those in FIG. 29 and FIG. 30. The semiconductor integrated circuit shown in the diagram, on which although no particular limitation is imposed, is formed on one semiconductor substrate (a semiconductor chip) such as that of a single crystal silicon, by means of CMOS integrated circuit production technique. The semiconductor integrated circuit has, for example, a microcomputer unit, an FPGA unit serving as a logic unit in which functions can be switched by the bistable MEMS switches of the present intention, an input/output circuit IO, a peripheral circuit unit, and a P-bus which is a peripheral bus. The microcomputer unit has a CPU (Central Processing Unit), and a flash memory unit and a RAM (Random Access Memory) serving as non-volatile memory units, which are commonly connected to an internal bus (I-bus). The peripheral circuit unit is connected to the P-bus 6, and IO is connected to P-bus and the I-bus. IO is interfaced with an unillustrated external bus and external peripheral circuit. The above described FPGA unit is connected with I-bus and IO. The above described other peripheral circuit, on which although no particular limitation is imposed, has a timer, a counter, or the like. Accordingly, a common programmable microcomputer including a non-volatile memory and a CPU, and a high-speed FPGA employing bistable MEMS switch elements, are formed on one chip, and the processing speed and degree of freedom are greatly improved.

Figure 32:
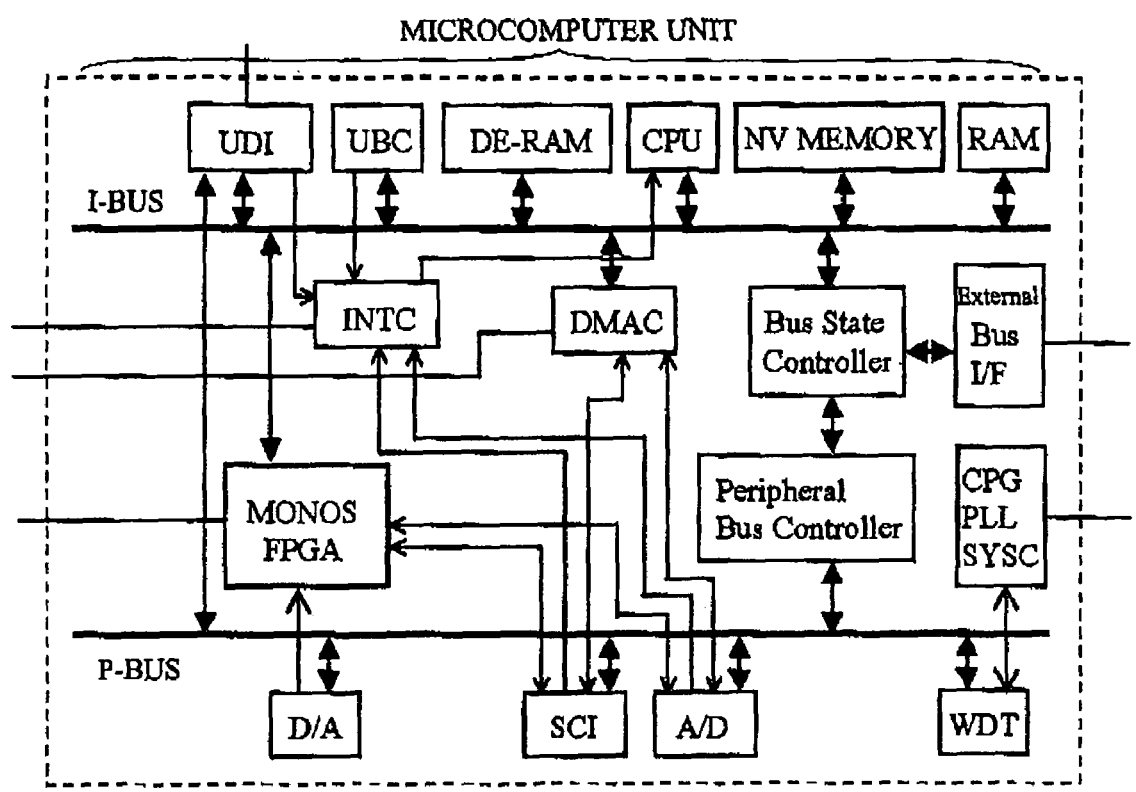
FIG. 32 is a diagram showing a configuration example of a microcomputer unit employed in the tenth embodiment of the present invention.

FIG. 32 shows details of the microcomputer unit of FIG. 31. UDI (User Debug Interface) is an input/output circuit for a user to perform debug, and connected to an unillustrated debug system. UBC (User Break Controller) is a controller for controlling break points upon system debugging. DE-RAM 17 is a RAM used as, for example, an emulation memory upon debugging. These are connected to I-bus together with CPU, a flash memory unit NV MEMORY, and RAM. INTC (interrupt controller) controls interruptions to CPU. DMAC (Direct Memory Controller) controls, in place of CPU, memory accesses. FPGA unit employing bistable MEMS switch elements is connected to I-bus. D/A and A/D are, respectively, a circuit for converting digital signals to analog signals, and a circuit for converting analog signals to digital signals. SCI is a serial interface circuit which is one of input/output circuits. An external bus interface (External Bus I/F) is an input/output circuit which interfaces with an external bus, and connected to I-bus via a bus state controller. The bus state controller is connected to P-bus via a peripheral bus controller. CPG (clock pulse generator) generates an internal standard clock signal. WDT (Watch Dog Timer) monitors runaway of CPU.

Figure 33:
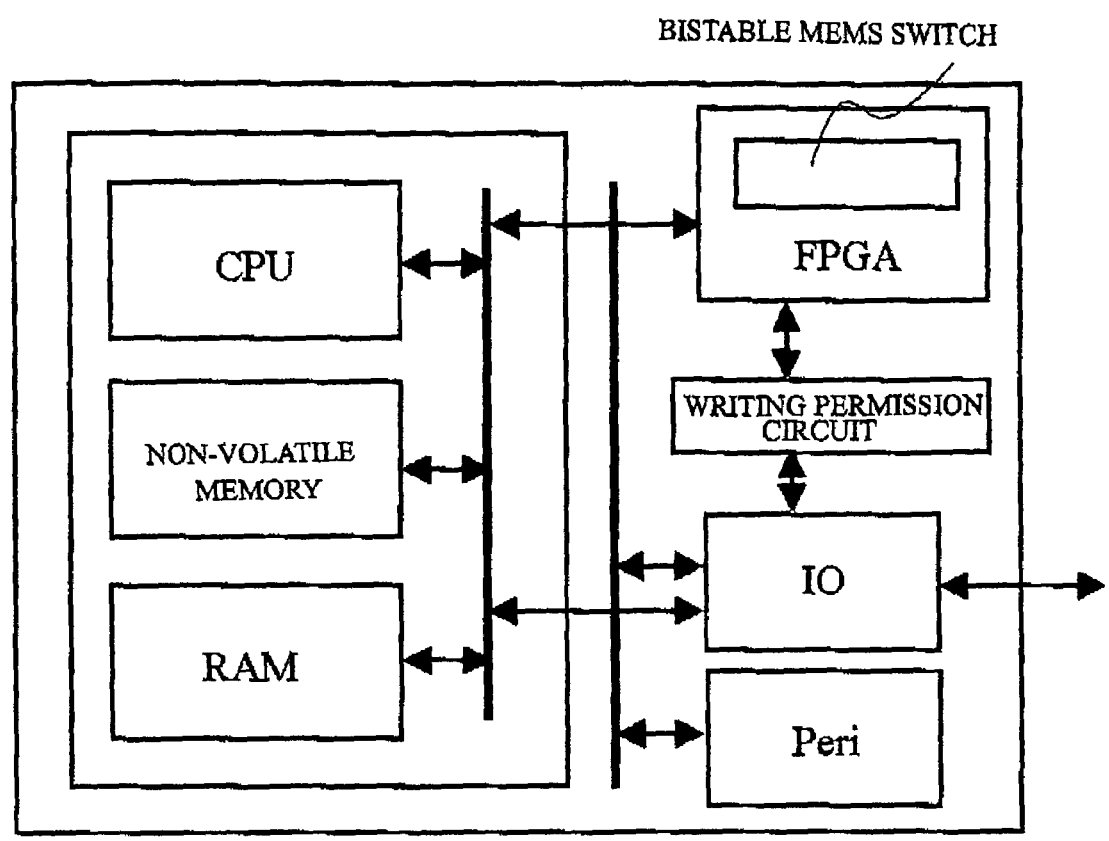
FIG. 33 is a diagram showing an eleventh embodiment of the present invention.

FIG. 33 shows another example of the semiconductor integrated circuit. In the semiconductor integrated circuit shown in the diagram, a writing permission circuit for FPGA unit is added to the structure of FIG. 32, in order to give permission from outside to change functions in FPGA. This circuit enables making a decision whether to perform function change or not. Therefore, the information that specific functions already configured by bistable MEMS switch elements are protected, or that the writing permission circuit is operated, is output to outside from IO, and the fact that the present invention has been utilized is detected. This can be employed for data such as of charging. The writing permission circuit corresponds to the charging, and has a function to give permission to the bistable MEMS switch elements in FPGA unit for making changes, and has two passwords, in order to realize a function, for example, to vary the writing permission region or area when a particular password is input via, for example, IO. The function may be configured such that a user can access only to writable part without providing passwords. As a password or a key, a command may be input. Alternatively, permission is given only when particular signal is provided with a particular terminal to a vendor region. Moreover, the particular terminal may be configured such that users can not touch it after a chip is sealed in the package.

Figure 34:
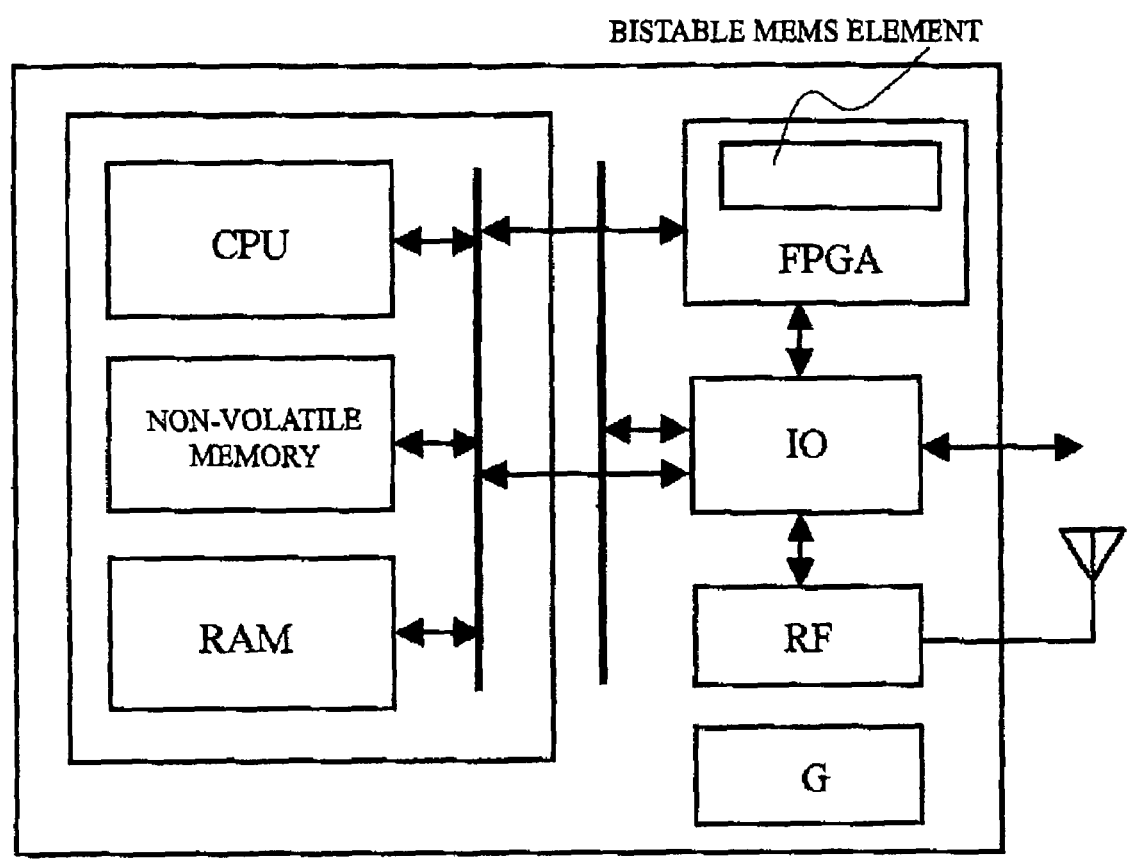
FIG. 34 is a diagram showing a twelfth embodiment of the present invention.

FIG. 34 shows an example in which a radio interface circuit (RF) is employed for programming an FPGA unit and a non-volatile memory unit. RF52 can make changes to the FPGA unit or the non-volatile memory unit by employing, for example, a high frequency of 2.4 GHz band via a radio network or other networks linked with the radio network. Therefore, adding new functions and correcting bugs, or the like are convenient, after the semiconductor integrated circuits are shipped, or after mounting to circuit substrates. Additionally, a writing permission circuit such as that in FIG. 33 may be provided, in order to give changing permission by a radio network, or to inform that changes have been made.

The present invention comprises a semiconductor integrated circuit in which functions can be switched by use of bistable MEMS switches, and the mechanism for switching functions include the methods described below. These findings are resulted from studies regarding development history of semiconductors, and with the methods based on the findings, the present invention attains effects which are not easily conceivable.

Figure 35:
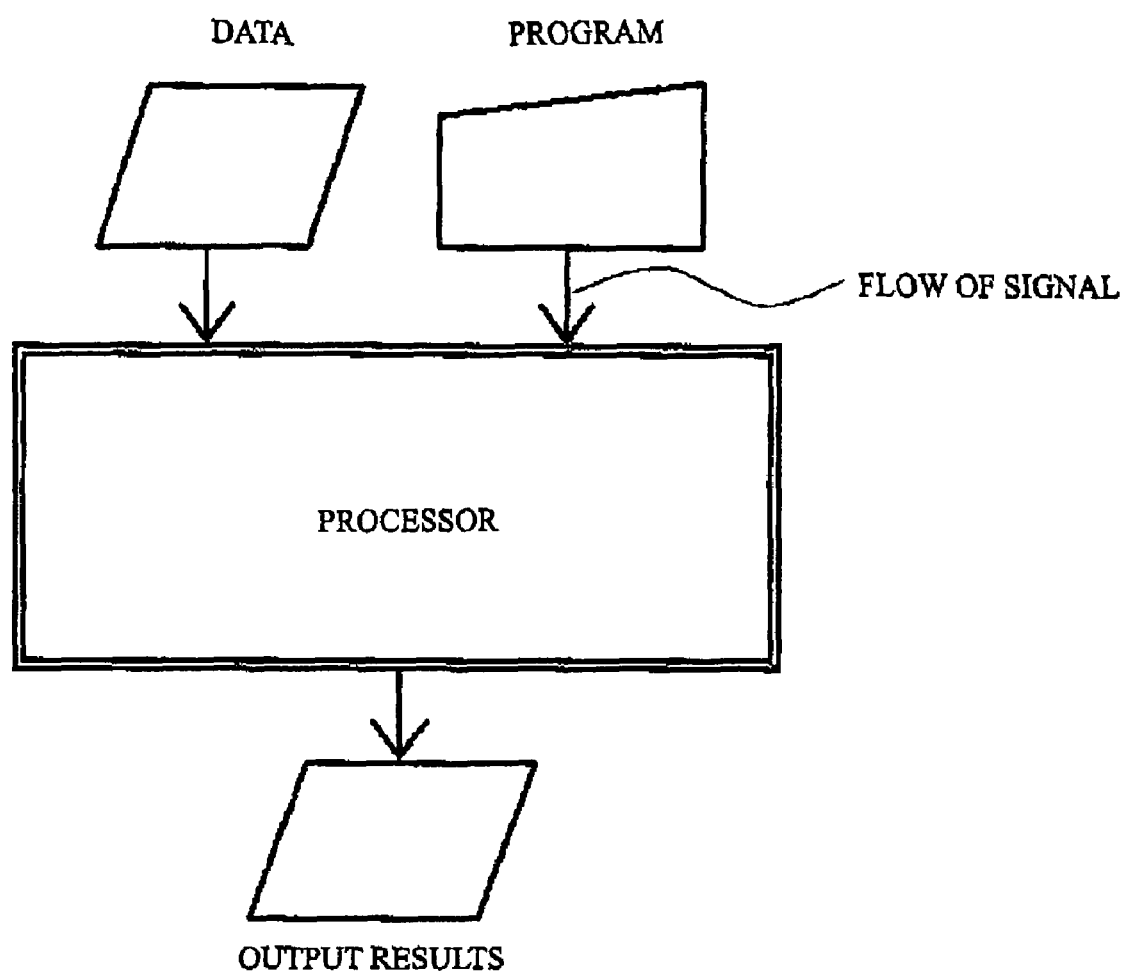
FIG. 35 is a diagram showing an example of a system to which the present invention can be applied.

FIG. 35 is a diagram showing the flow of data processing to which connection switchable circuit blocks according to the present invention can be applied. As shown in FIG. 35, generally in a semiconductor integrated circuit which processes signals, data and a program are given, and processor performs processing based on the data and the program so as to obtain output results. The program herein refers to that specifying processing method. The process may be considered as one in whole. Alternatively, the process may be considered as an assembly of processes performed, in time course, sequentially or simultaneously in a diverging way, i.e., in an example case, a process A is performed first, subsequently a process B is performed while a process C is performed at the same time, and based on the resultant conditions, a process D is performed, or a process E may be performed. The processor performs processes according to the processing method described in the program. The processor may also be considered as one in whole. Alternatively, the processor may be considered to be separated into various parts, for example, into a part operated upon performing a process A, and a part operated upon performing a process C; and in terms of time, there may be a case in which a process A is completed instantly and a process B requires more time. By providing a connection switchable circuit block, for example, a variable logic gate array unit, according to the present invention, to the processor of FIG. 35, functions of the processor can be changed. Particularly, by employing MEMS switch elements, the speed of function change can be accelerated, and a function changeable processor of small area can be realized. Specific modes of the data processing flow employing a processor to which the present invention is applied, will be explained by use of FIG. 36 to 38 below.

Figure 36:
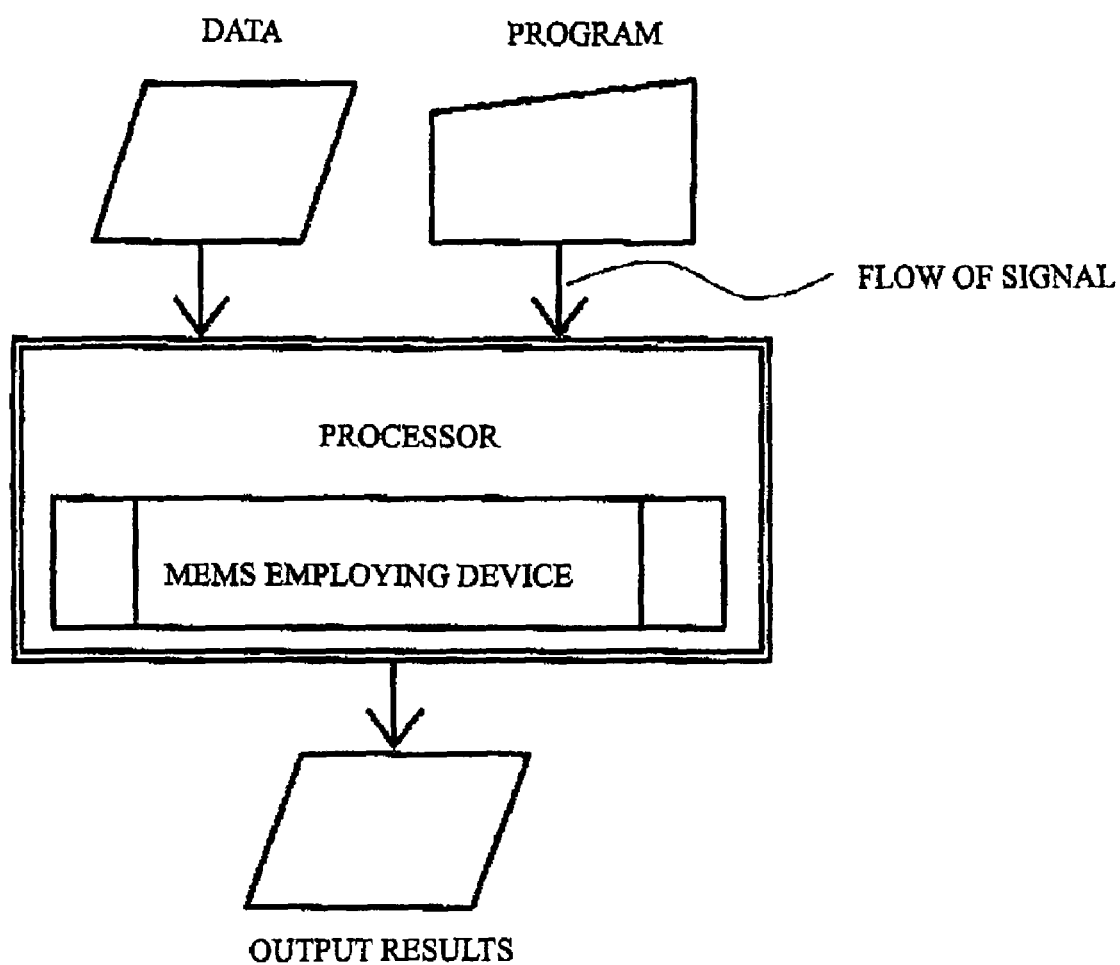
FIG. 36 is a diagram showing an example of a system employing the present invention, which is a thirteenth embodiment of the present invention.

FIG. 36 is a diagram showing a first mode of the data processing flow by use of a processor in which functions are configured to be switchable by having a connection switchable circuit block according to the present invention, particularly, a device employing MEMS such as a variable logic gate array unit. In the present embodiment, a device employing bistable MEMS switches is provided in the processor. In the first mode, the device employing MEMS is operated in accordance with a program. The operation methods are roughly in three types. In the first method, the use of the device employing MEMS is specified in the program. This is available, for example, when the program designer knows the load and time required for the process. In the second method, there provided, in the processor, a part in which the working characteristics of each part of the processor corresponding to the activation degree or process in each part, are measured and compared with an internally prepared list so as to judge the conditions. When the load surpasses a certain limit, or when specific processes are provided, the functions of the device which employs MEMS are changed so as to solve the problems, In the third method, the devices employing MEMS are disposed in a plurality of parts in the processor, and in accordance with the conditions of the parts, the functions thereof are changed. In every method, processes are performed in accordance with the program.

Figure 37:
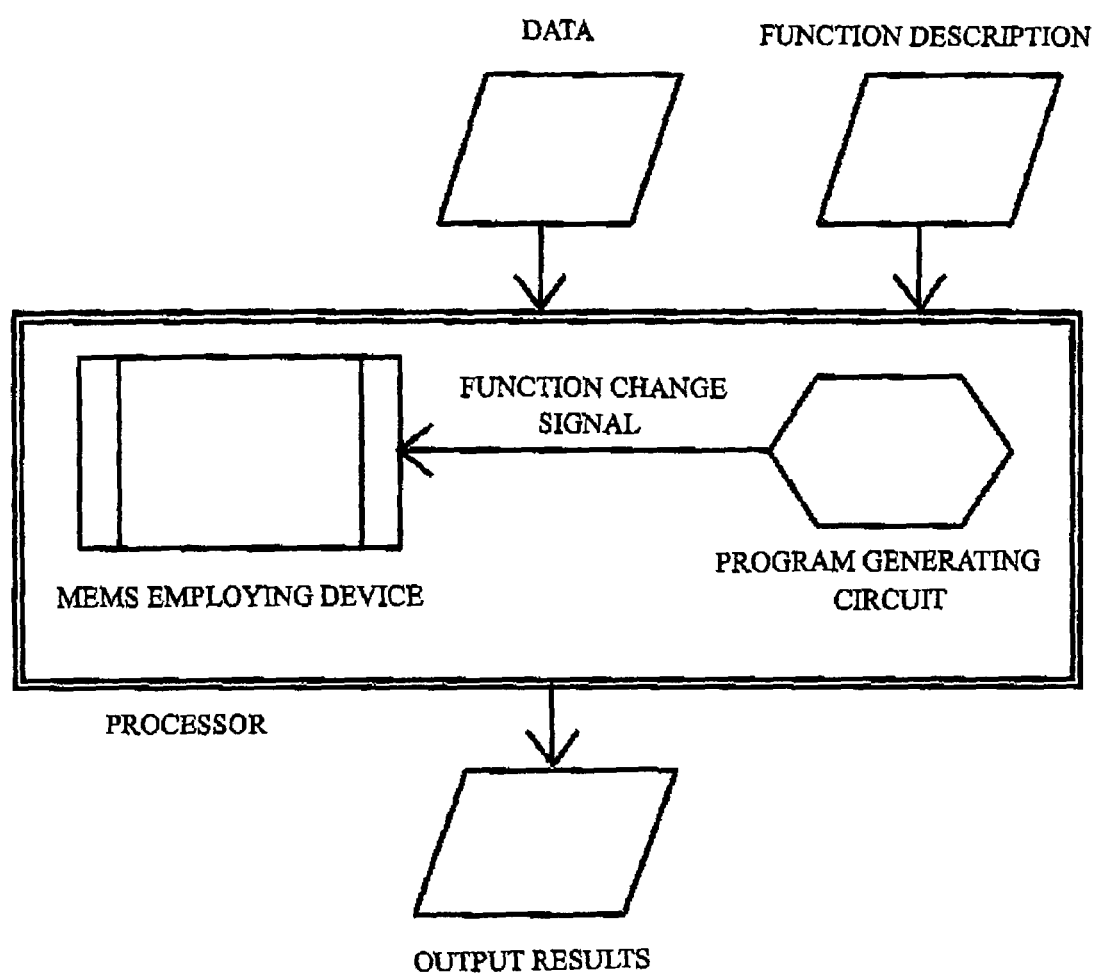
FIG. 37 is a diagram showing another example of a system employing the present invention, which is a fourteenth embodiment of the present invention.

FIG. 37 is a diagram showing a second mode which is a modification of the above described first mode, and the diagram showing a data processing flow employing a processor which can change the scheme of the process more minutely than the contents (function description) written in a program input from outside. In order to realize this, there employed, in the processor, a program generating circuit which generates function change signals based on the function description input from outside, and give the signal to a device employing MEMS, for example, a variable logic gate array unit; as a mechanism which enables function change by use of the bistable MEMS switches according to the present invention. The bistable MEMS switches occupy small area since they can be disposed above CMOS elements, and attain high speed. The processing scheme can be more minutely changed than the description of the program, in other words, the program does not have to be written in detail. Therefore, as shown in FIG. 37, with the present invention, in the second modification, the process contents do not have to be a detailed program, but a function description describing what process to perform and what kind of data to be treated, so as to realize a proper device. The processor has a mechanism to generate a program based on the function description, and with its function change signals, the device employing MEMS realizes desired functions.

Figure 38:
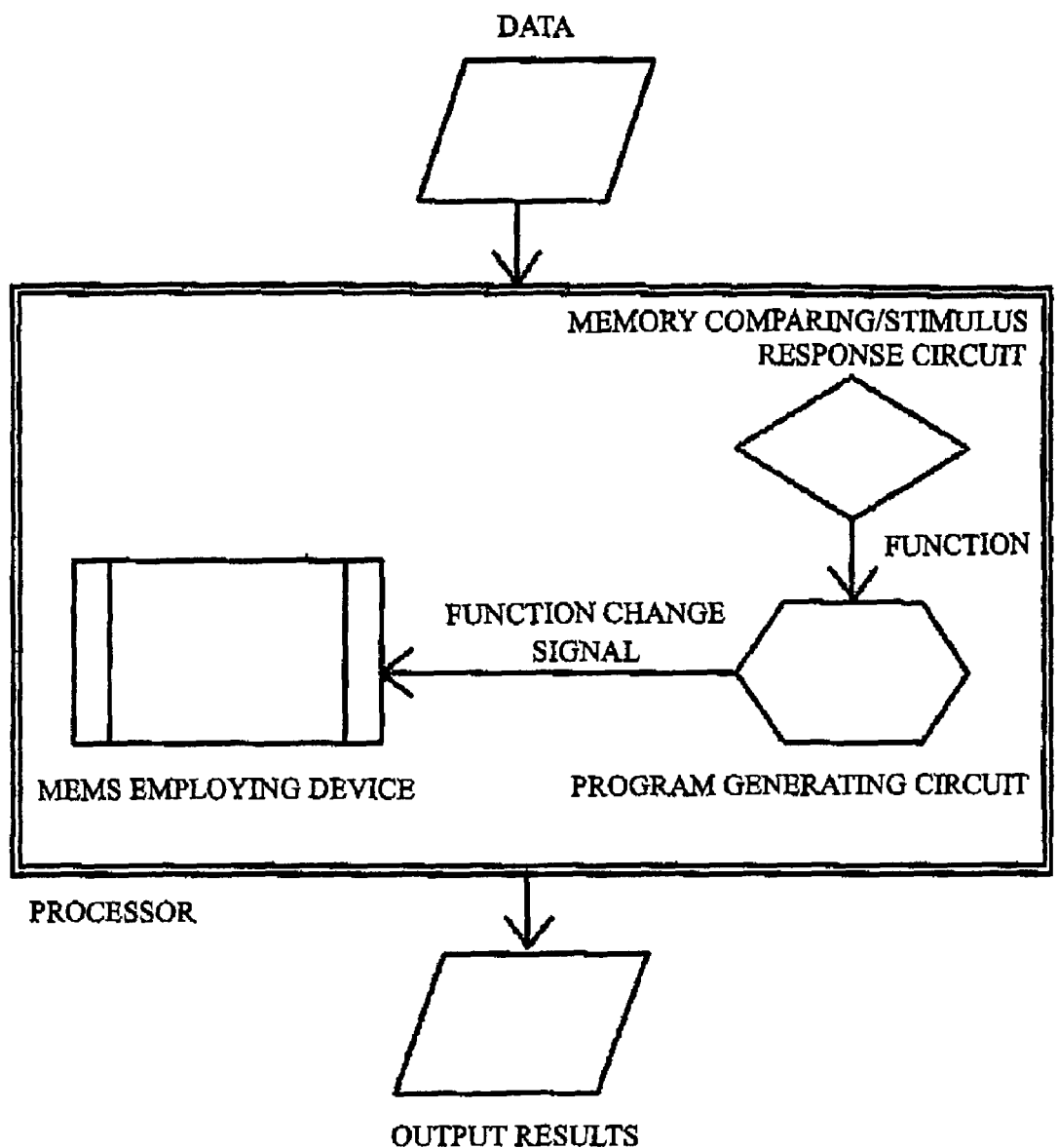
FIG. 38 is a diagram showing another example of a system employing the present invention, which is a fifteenth embodiment of the present invention.

FIG. 38 is a diagram showing a third mode which is a modification example of the above described second mode; and the diagram showing a data processing flow employing a processor in which, instead of the constitution wherein function description is input from outside, there provided in the processor, a circuit which gives function data to a program generating circuit, for example, a memory comparing/stimulus response circuit, wherein the circuit enables changing the process scheme more minutely than the contents (function description) written in a program. When data is solely provided to the processor, the internal connections of a device employing MEMS, for example, a variable logic gate array unit, are made changeable by the memory comparing/stimulus response circuit which stores and judges, for example, the past history, response contents which have been given in advance, and scheme that have been learned in the past processes. Accordingly, the functions of the processor can be changed. Herein, the thing given from outside is merely the data, and the data comprises, for example, contents of the process, contents reporting the conditions, and contents indicating expected outputs. In the processor, necessary functions are produced by the memory comparing/stimulus response circuit from the data, the program generating circuit generates a program in accordance with the functions and transmits function change signals to the device employing MEMS so as to generate necessary functions and perform processes.

As described above, with the present invention, there realized a semiconductor circuit/device which changes the contents of new functions, the new functions being realized by combinations of logic elements having certain functions in a semiconductor circuit/device which changes functions in a logic basic element (i.e., NAND element and NOR element) level; and a semiconductor circuit/device in which the function changes are made not only by direct commands from outside, but also the functions are changed autonomically since desired outputs are obtained from the input data.

Figure 39:
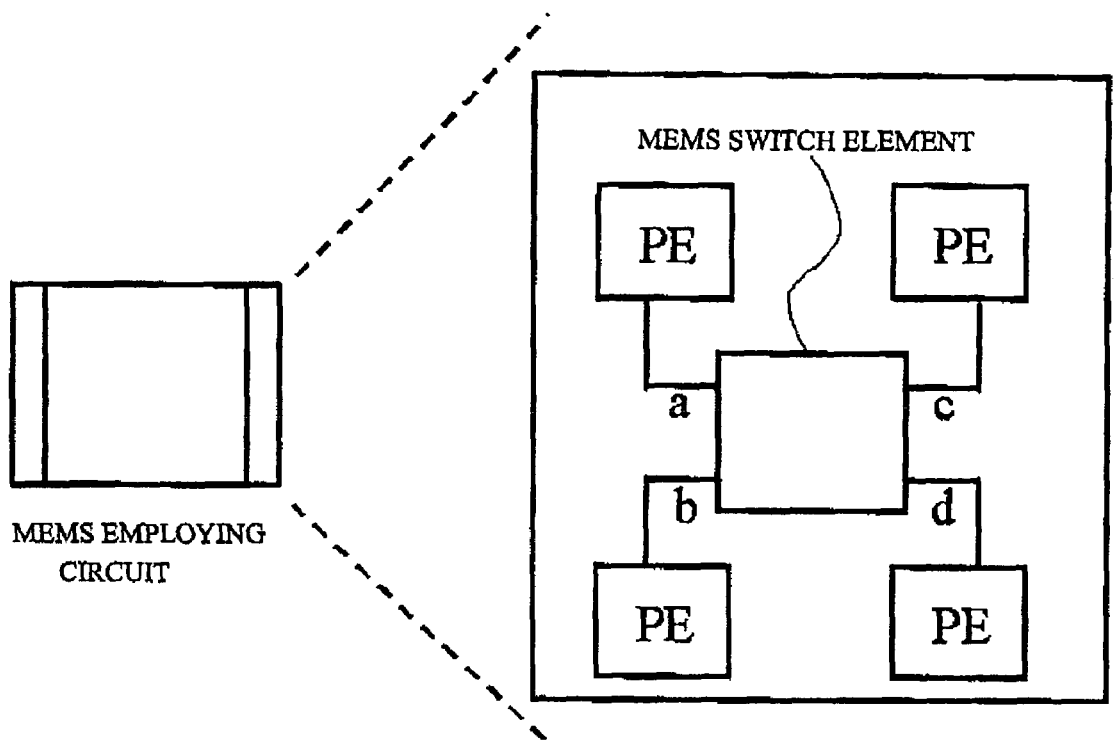
FIG. 39 is a diagram showing a sixteenth embodiment of the present invention.
Figure 40:
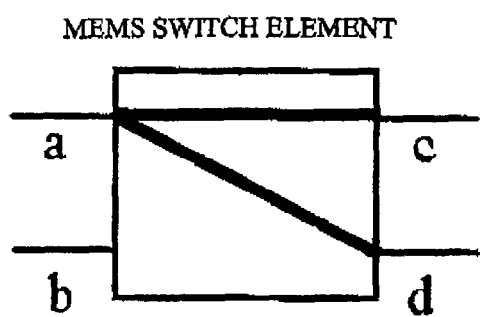
FIG. 40 is a diagram showing an example of a state of the sixteenth embodiment of the present invention.
Figure 41:
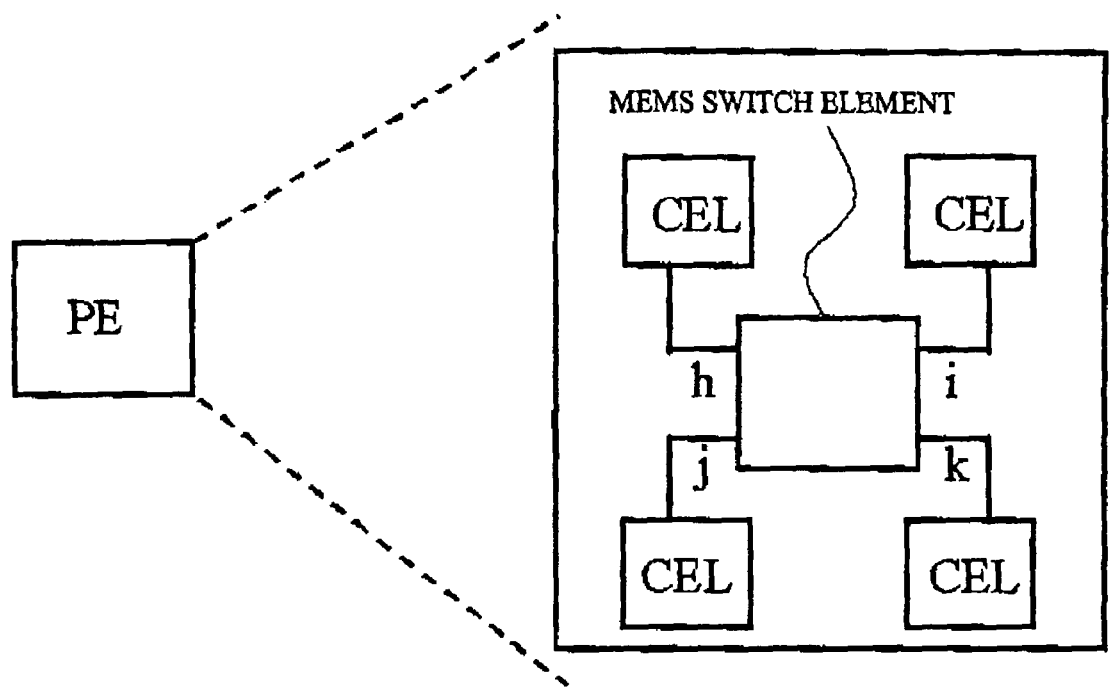
FIG. 41 is a diagram showing a subordinate configuration example of the sixteenth embodiment of the present invention.

The devices of the above described embodiments may be employed as the device employing MEMS, which is employed in the above described modes. FIG. 39 shows another embodiment having a fractal structure. In the diagram, PE denotes a circuit which processes signals, and there provided four of these. The signals from the circuits are represented by a, b, c, and d, and are connected to a MEMS switch element. The MEMS switch element is, as its detail is shown in FIG. 40, remarkably simple in terms of a function; and can make connections between any of a, b, c, and d, and a plurality of combinations of the connections can be made. In the diagram, a is connected with c, and a is connected with d. This is easily realized by employing bistable MEMS switches described in the foregoing embodiments, in each of the two combinations. In addition, as described hereinabove, the connection can be switched, therefore the functions performed by the device can be changed. Another characteristic feature of the present embodiment resides in that, the structure of PE of FIG. 39 also has, as shown in FIG. 41, circuits CEL which process signals, and MEMS switch elements which set the connections thereof. By providing such structure, high-speed processing can be performed with a simple production method. The CEL may also be constituted by similar plural signal processing circuits and MEMS switch elements which set the connections thereof. Also, CEL may be a logic circuit such as a general ALU, or may be constituted by circuits in which functions can be switched by MEMS switch elements which are explained in foregoing embodiments. When CEL is constituted by plural signal processing circuits and MEMS switch elements which set the connections thereof, the signal processing device may be constituted by circuits, in which functions can be changed by general logic circuits or MEMS switch elements. Further, the same structure may be repeated.

Figure 42:
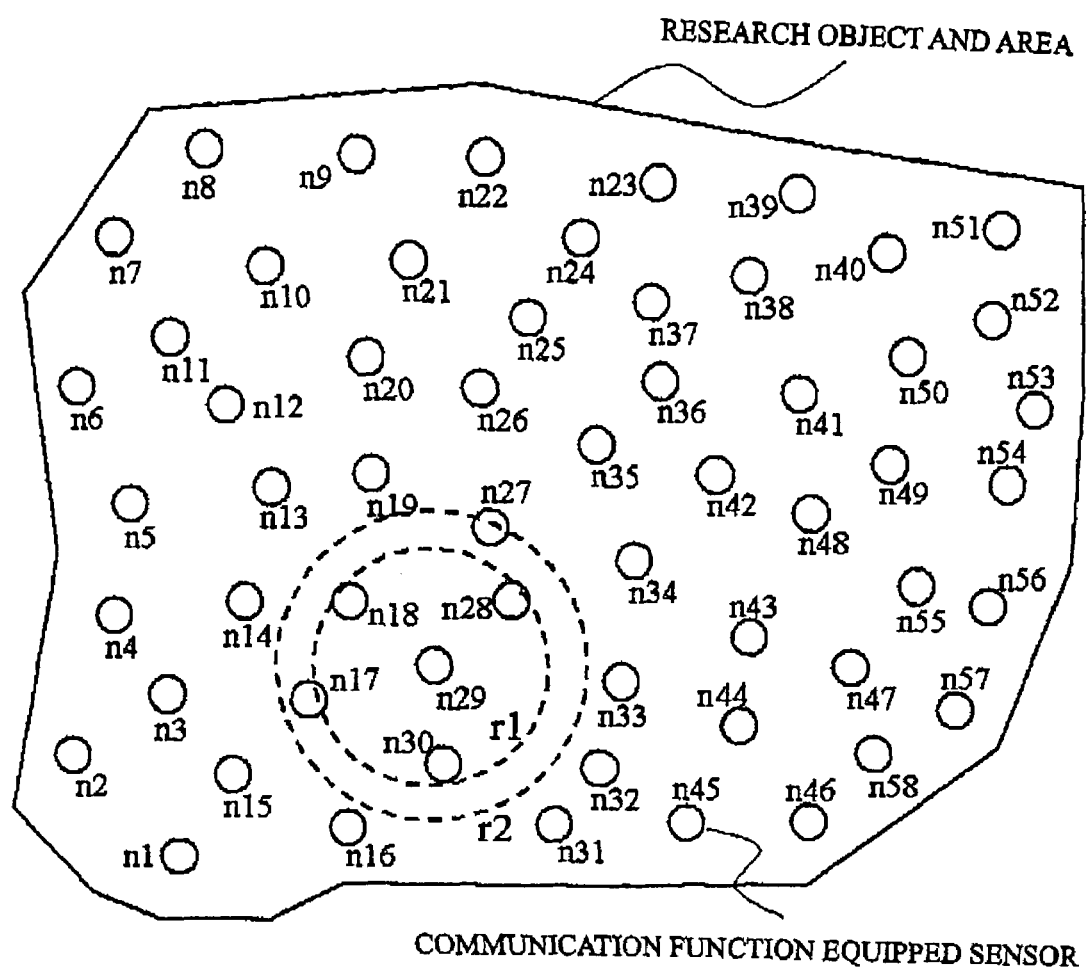
FIG. 42 is a diagram showing an example of a system employing the present invention, which is a seventeenth embodiment of the present invention.

FIG. 42 shows an application example of function changeable integrated circuits and devices employing the present invention. In the diagram, research object and area may be, for example, a configuration of a field to which agricultural crops are planted, or a structure such as a building. Meanwhile, n1 to n58 denote devices having integrated circuits to which the present invention is applied, provided with communication function, and sensors capable of measuring and sensing, for example, temperature, degree of humidity, pressure, degree of acidity, and degree of light. For example, in a case of an orchard which is a field having planted agricultural crops, the device employing the present invention is provided to each of, for example, apple trees. In the example of the diagram, 58 apple trees are provided corresponding to n1 to n58, the arrangement thereof is as shown in the diagram, and the entirety is the region described as the research object and area. Alternatively, although the configuration will be different from the diagram, there may be a case in which devices employing the present invention are made sufficiently small, upon constructing a building, a number of the devices are mingled in concrete, and the building is built with the concrete. In this case, the constitution of reinforcement core parts of the building in which the concrete is spread, corresponds to the research object and area of the diagram. Herein, the devices which are mingled in the concrete and employs the present invention, correspond to the communication function equipped sensors in the diagram. Alternatively, the devices of the present invention are made by decomposable organic semiconductor, and bistable MEMS switches are also comprised by electric-conductive organic matter which attains similar function. In a case in which these are scattered from an aircraft to an objected region (for example, the desert where greening is aimed), or scattered from a space craft to the Mars in a similarly objected region (for example, a region to be modified so that human can live in), the above described regions correspond to the research object and area of the diagram, and the scattered devices employing the present invention correspond to the communication function equipped sensors.

Figure 43:
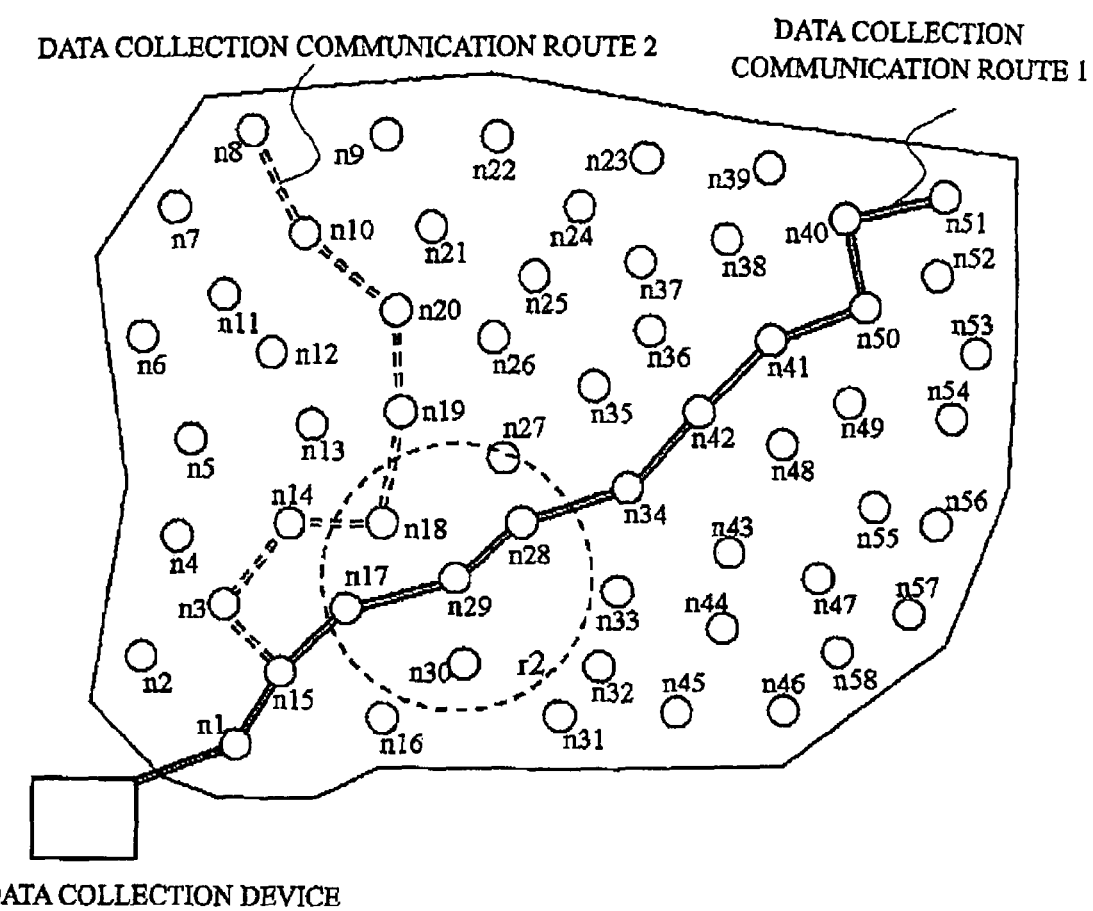
FIG. 43 is a diagram showing another example of a system employing the present invention, which is an eighteenth embodiment of the present invention.

An example in an apple orchard will next be described. The communication function equipped sensor collects, for example, temperature, degree of humidity, illuminance, and carbon dioxide concentration, at the place of an apple tree to which the sensor is attached; and transmits the data by use of the communication function. Herein, when attention is focused on, for example, n29, three apple trees n18, n28, and n30 are provided in the n29-centered radius region r1. In addition to these, n17 and n27 are provided, and five trees are in a larger radius region r2. Next, with FIG. 43, the carbon dioxide concentration at each tree of the apple orchard is to be sought. Since the carbon dioxide concentration is commensurate with the exuberance degree of tree leaves, the exuberance degree of an arbitrary tree in the apple orchard can be roughly grasped. Herein, when the present invention is employed, the procedure will be as the following. One tree is arbitrarily selected, in the diagram, n1 is selected, and a data collection device is placed near the tree.

The device communicates with the device employing the present invention which is provided at n1. Herein, when the data collection device is to communicate directly with, for example, n51, strong radio waves have to be generated from both sides. This is unrealistic, because providing power wires to the devices which are attached to trees costs, regarding the size of a general apple orchard; and the maintenance of the power wires which are exposed to weather changes, costs a lot. Therefore, such radio wave having a large output power cannot be used. Under the Radio Law of Japan, for example, only the output power of about 1 mW or less is allowed obtaining a particular license for the apple orchard will be a great burden. Therefore, the devices have to be operated with a minimum output power, on the presupposition of battery driving. Even though the output power is small, as described later, by relaying the radio wave by the devices employing the present invention; the data of n51 which is far away from the data collection device, is transmitted sequentially from n51, n40, n50, n41, n42, n34, n28, n29, n17, n15, and to n1, and transmitted from n1 to the data collection device, and vice versa. There emerges a question, in that degree of the strength of the radio wave depends greatly on the conditions of the surrounding trees. Returning to n29 of FIG. 42, whether the degree of the strength is that the radio wave reaches to the distance of r1, or r2, is different in each case. Herein, "radio wave reaches" means that there provided a radio wave having a strength sufficient to be detected by each device and the data can be transmitted. The adjustment of the output power can be performed by employing the device of the present invention, since the functions can be changed. In addition, the function can be specified which one to sense among various kinds of data to be sensed.

Accordingly, minimum operations are performed at each apple tree, and little electric power is consumed. When data collection is not performed; for example, only once in every ten seconds, detection is performed to check whether radio waves have been arrived, alternatively, the data from the sensor at the moment is written into a memory, and, in other time, it may be configured so as to perform no operation and consume almost no electricity. When the data collection device is operated, in accordance with the signals thereof, the bistable MEMS switches are switched sequentially so as to be able to transmit obtained data. At the same time, in order to obtain functions of desirable sensors, the bistable MEMS switches are also switched sequentially. In such a case, or in the above described case for collecting data, the strength of the generated radio waves are changed depending on the data of trees surrounding each device. When the data collection device communicates only with n1, the data of n51 is transmitted via the above described route, and the data of n8 is transmitted via n10, n20, n19, n18, n14, n3, n15, and n1. Herein, a question arises that how much strength of the radio wave and distance in which the radio wave reaches are required, in order to collect the data of all trees by the data collection device without failure. A property of such system is known. That is, when the distance reached by the radio waves is extended little by little, the areas of the distance reached by the radio waves of the trees are lapped over with each other; and when a certain distance is set to be reached, the data of all trees can be output via n1, which is the property. In other words, when time lag can be ignored, all devices are connected via radio waves. That is called percolation, and the illustration of this property is as shown in FIG. 44.

Figure 44:
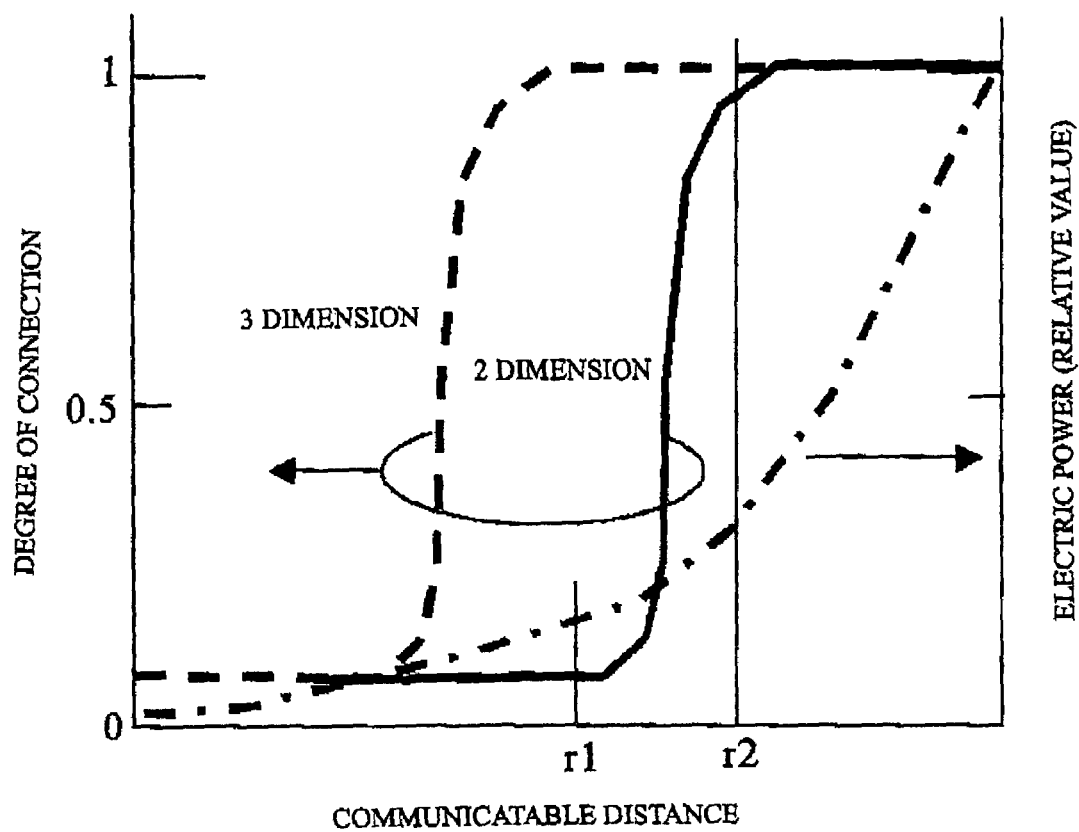
FIG. 44 is a diagram showing operation examples of the seventeenth and eighteenth embodiments of the present invention.

In FIG. 44, horizontal axis indicates the communicatable distance, and the left vertical axis indicates the degree of connection, wherein 1 refers to a state in which all devices are connected via radio waves. The right axis indicates the electric power required to transmit radio waves in the distance indicated by the horizontal axis, and the increase of the electric power herein is commensurate with the square of the distance. When the communicatable distance is extended to r2 of small electric power, a connected state is drastically attained, in accordance with the percolation property. In an actual apple orchard, as described above, although the distances between trees have variety, and radio wave conductivity varies depending on the exuberance degree of leaves; above described r2 assumes a certain value in one apple orchard. The connected state is attained when the radio wave is reached in the distance which is roughly equal to the radius of a circle drawn so as to include five apple trees while having one apple tree as its center. That is, that correspond to the distance equal to the radius of a circle which includes five devices when the circle is drawn to have one device as its center. The property is different when the devices of the present invention are arranged three-dimensionally, for example, like the above described case in which the devices are included in concrete of a building. In such case, a connected state is attained when about two devices are included in a sphere which is drawn to have one device as its center. That is, comparing a two-dimensional arrangement such as that of an apple orchard, with a three-dimensional arrangement such as that in concrete, the three-dimensional arrangement attains entirely connected state with fewer number. Also in such property, when the present invention is employed, the function can be set so as to have a minimum radio wave state in which the entirely connected state is attained, therefore electric power can be lowered. Also, an appropriate constitution may be employed corresponding to a two-dimensional arrangement, or a three-dimensional arrangement.

Figure 45:
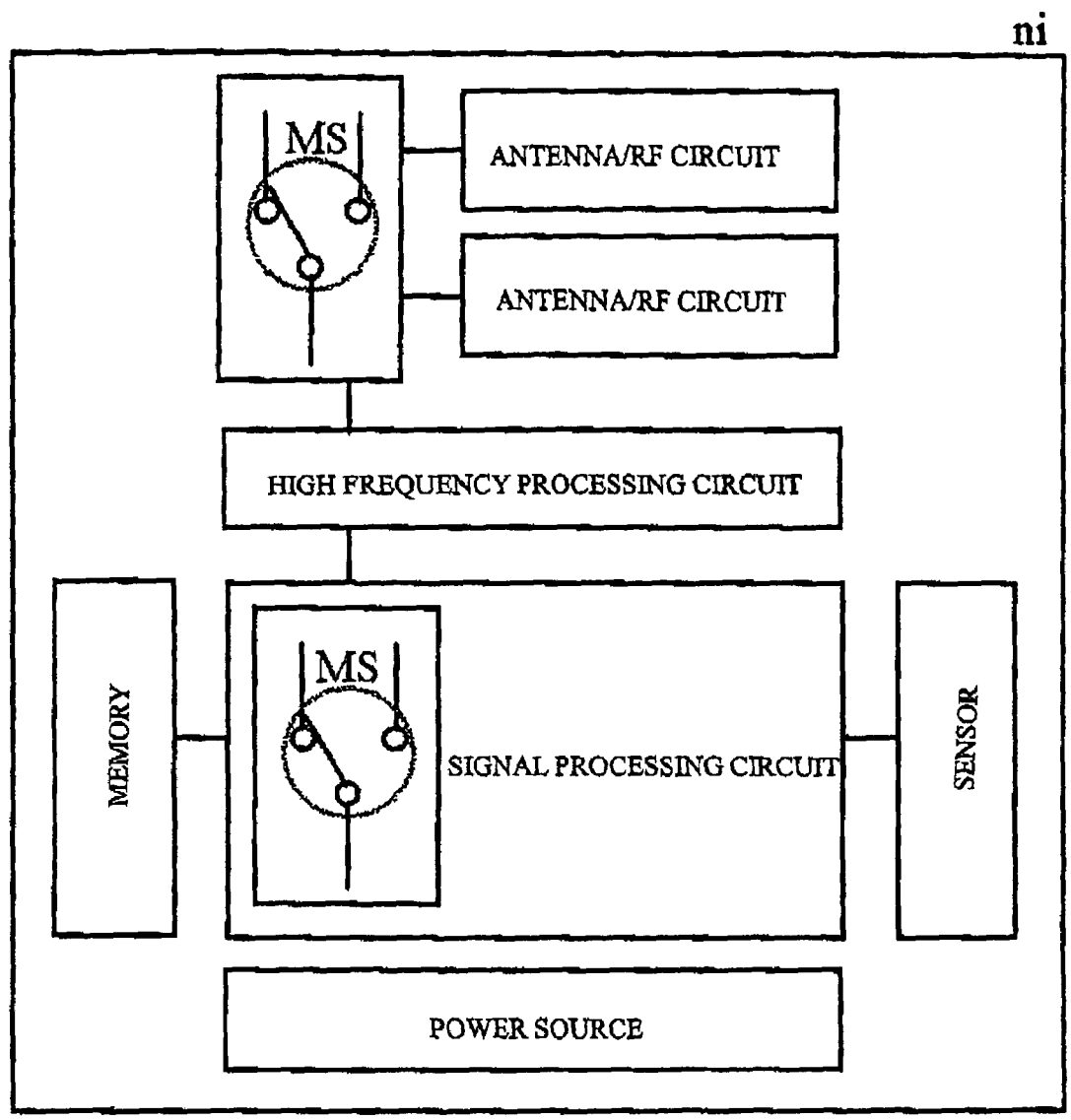
FIG. 45 is a diagram showing a nineteenth embodiment of the present invention.

An example device ni which is employed in the above described diagrams is shown in FIG. 45. The device is constituted by one chip or a plurality of chips; and a sensor, a signal processing device which processes the signal of the sensor, and a memory are provided. The signal processing device can change functions by use of a bistable MEMS; and in those having functions for adjusting sensor sensitivity, or a plurality of sensor functions, the functions can be changed so as to properly process signals in accordance with the sensor functions. The signal processing device is connected to a high-frequency processing device, In the diagram, two kinds of antenna/RF circuits are provided, and these are selected by a bistable MEMS switch to use. As a power source, there may be provided a general storage battery, a fuel cell, an electric power generation function, a case in which electric power is generated by wind power, a solar battery, or a method in which vibration energy is converted to electric power.

In the present invention, non-volatile memories are employed for storing data, however flash memories, FeRAM, MRAM, and phase change memories may be employed for that. Also, non-volatile memories employing nanostructure may be employed.

Figure 46A:
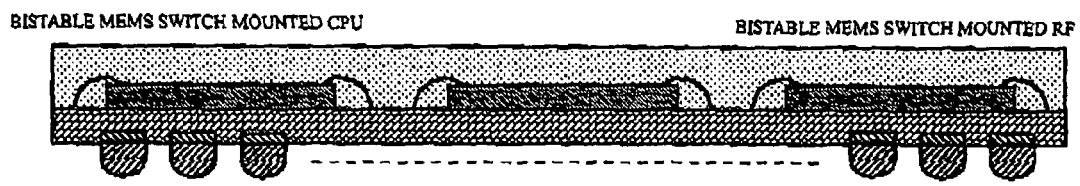
FIGS. 46A and 46B includes diagrams showing a twentieth embodiment of the present invention.
Figure 46B:
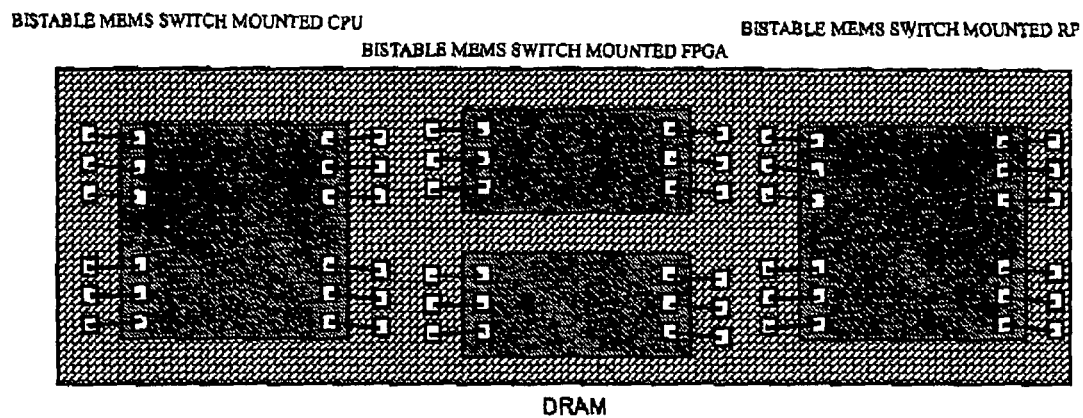

FIGS. 46A and 46B show a semiconductor device according to the present invention, which is made as an MCM (Multi Chip Module). FIG. 46A is a plan view, and FIG. 46B is a front view. The device comprises, a CPU chip in which bistable MEMS switches are provided and functions can be switched, an FPGA chip provided with bistable MEMS switches, and an RF chip provided with bistable MEMS switches, mounted on a high-density printed circuit board. With the device, the functions which a user wants to realize, can be realized with high performance and in shorter time compare with the case in which a single-chip is employed.

Figure 47A:
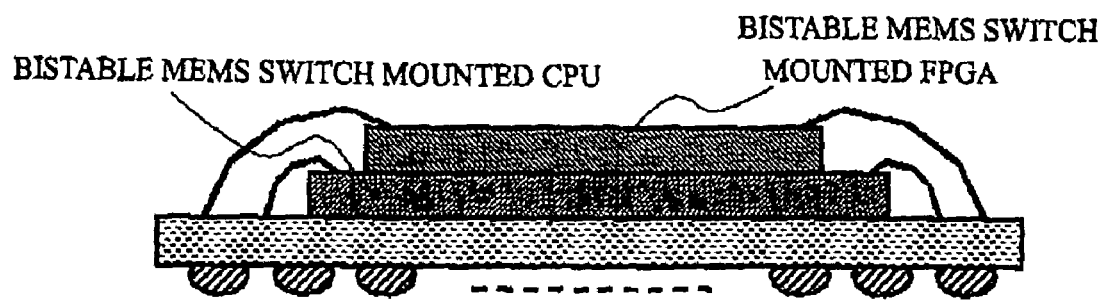
FIGS. 47A and 47B includes diagrams showing a twenty-first embodiment of the present invention.
Figure 47B:
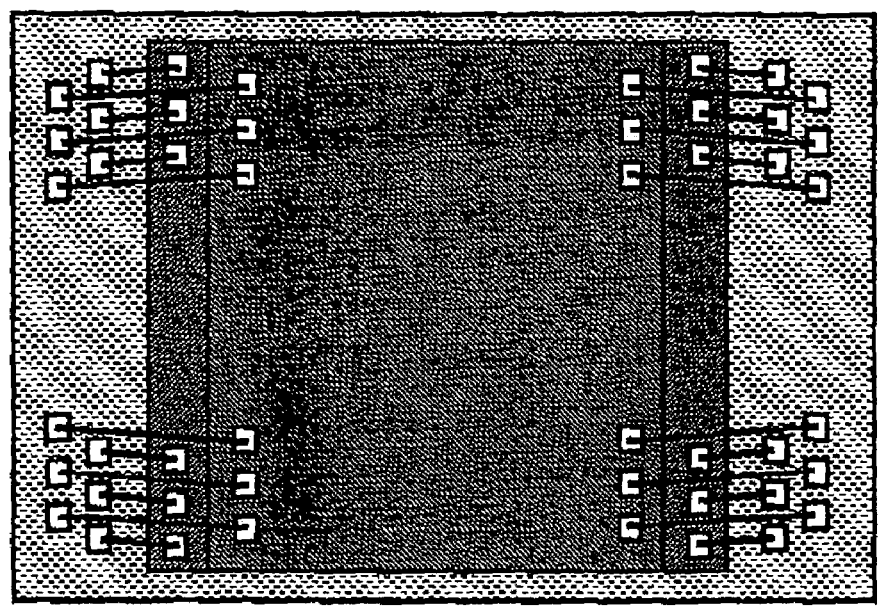

FIGS. 47A and 47B show a semiconductor device according to the present invention, which is made as an MCP (Multi Chip Package). FIG. 47A is a plan view, and FIG. 47B is a front view. The semiconductor device made as an MCP comprises a CPU chip in which bistable MEMS switches are provided and functions can be switched, and an FPGA chip provided with bistable MEMS switches. With the device, a system in which test manufacturing time is short and electricity consumption is low, can be constituted.

Figure 48:
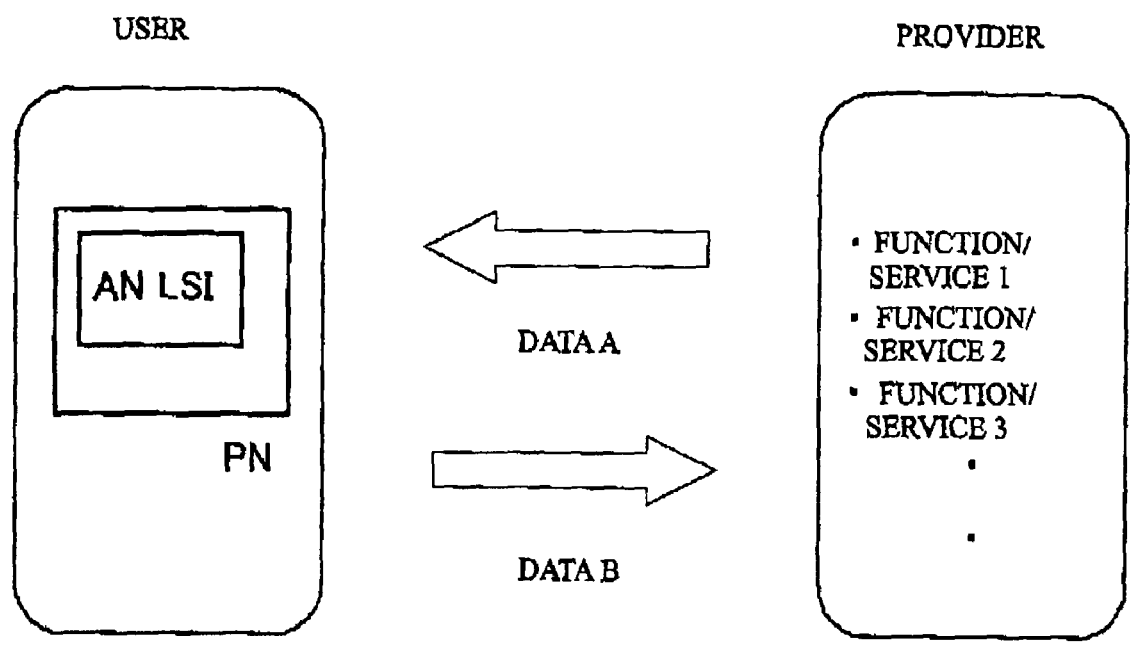
FIG. 48 is a diagram showing an example of a system employing the present invention, which is a twenty-second embodiment of the present invention.

A device which is used in a way shown in FIG. 48 can be realized by employing the present invention. An electronic device PN is provided at a user side. The electronic device includes a semiconductor device AN LSI employing the present invention. The semiconductor device of the present invention may be a computing device having functions which are appropriate for performing advanced recognition processes, or may be a computing device having functions which are appropriate for high-speed processing of decoding method for highly-advanced codes. Meanwhile, data (e.g., a program, and a connection method of the bistable MEMS switches in AN LSI) required for realizing various functions and services at above described PN, is provided at a provider side. When data A is transmitted from the provider side to the user side, for example, AN LSI generates functions required for decoding codes, which takes a very long time in a common LSI. With this, for example, biometrics of the user by use of the electronic device PN can be performed at the user side. The data regarding, for example, selections of the function and service, or the data of transferring money which is to be paid upon operation of PN in accordance with the data from the provider side, is transmitted as data B from the user side to the provider side.

Figure 49:
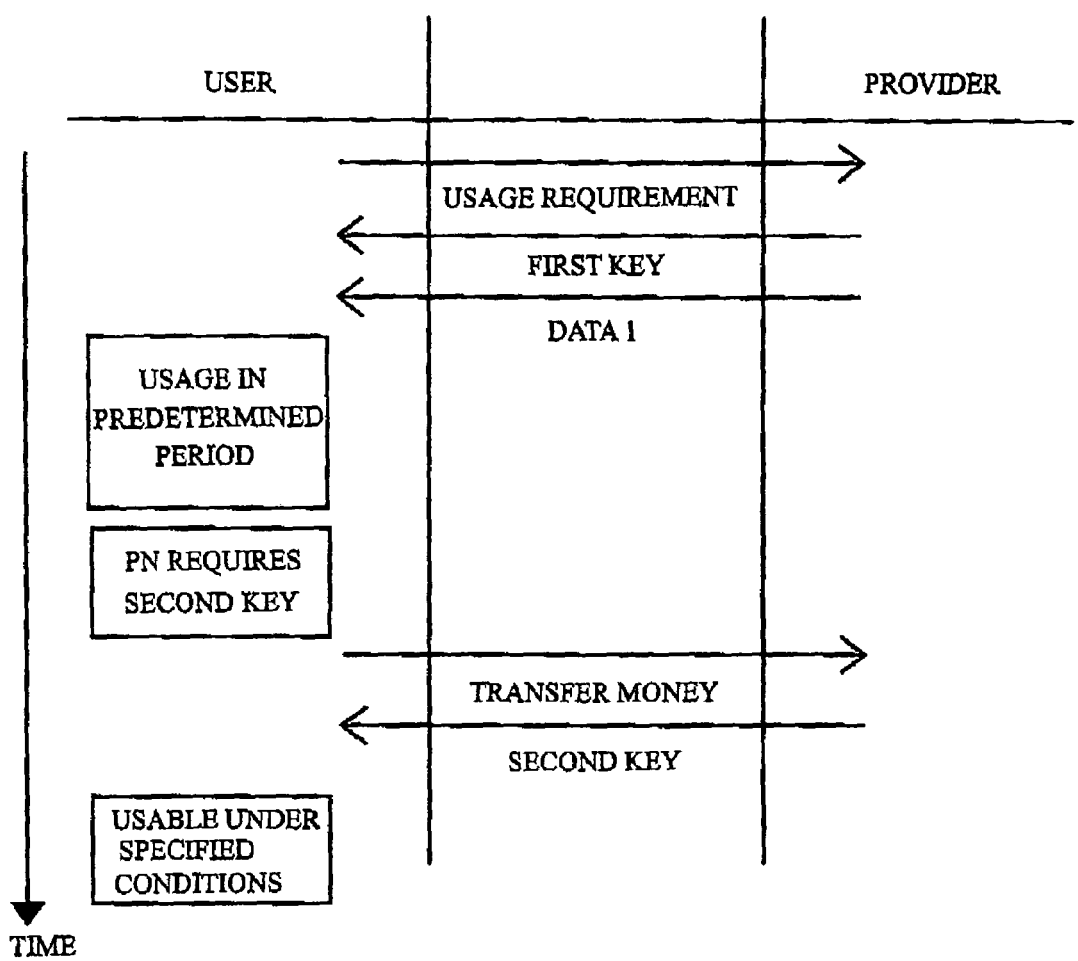
FIG. 49 is a diagram showing operation examples of the twenty-second embodiment of the present invention.

An example is shown in FIG. 49. First, a request (usage request) regarding usage of a certain function and service is sent from the user side to the provider side. Then, a first key (data) and data 1 is transmitted from the provider side to the user side. At AN LSI, a desired function is produced by switching the bistable MEMS switches, based on the data 1. Accordingly, the desired function and service can be used at the user side for a predetermined period of time, by use of PN. When the predetermined period of time is over, PN requires the user to input a second key, with a mention notifying that the function and service can be used, for example, no more than one time without inputting the second key, If the second key is not input, then, after one time usage, the function and service can no longer be used. After the usage of the one time, AN LSI switches bistable MEMS switches, therefore the function which had been generated can no longer be used. When the usage is to be continued, usage fee is transferred from the user side to the provider side. Then, the second key (data) is transmitted. By inputting it to PN, the usage by the user is made possible under specified conditions. As described above, when a device and function employing the present invention are used, the provider side can carry out charging.

The present invention has industrial applicability relating to an LSI in which functions can be changed, particularly to a system LSI in which the functions are changed by changing connections of the circuits by use of MEMS switches.

What is claimed is:

1. A device comprising:
    at least one variable logic gate array unit, wherein
    at least one said variable logic gate array unit comprises a mechanical element switch for switching a connection in the variable logic gate array unit,
    the mechanical element switch is designed to have two stable states or a bistable state, the variable logic gate array unit comprises an AND plane which performs a product operation; an OR plane which is electrically connected with the AND plane and performs an addition operation; a plurality of input gates connected to the AND plane; and output gates which are connected to the OR plane and provided in the same number with the input gates, and product and addition operations of the signals input from the plural input gates are performed, and the results of the product and addition operations are output from the output gates.

2. The device according to claim 1, wherein
the mechanical element switch is integrally formed in a CMOS integrated circuit together with the variable logic gate array unit.

3. The device according to claim 1, wherein
either state in the above described bistable state is specified according to a signal from outside the device.

4. The device according to claim 1 further comprising:
at least one additional variable logic gate array unit; wherein
the additional variable logic gate array unit and the above described variable logic gate array unit can form a composite variable logic gate array based on switching of the connection in the above described variable logic gate array unit by the mechanical element switch.

5. A device comprising:
at least one variable logic gate array unit, wherein
at least one said variable logic gate array unit comprises a mechanical element switch for switching a connection in the variable logic gate array unit,
the mechanical element switch is designed to have two stable states or a bistable state,
the variable logic gate array unit comprises a plurality of circuit blocks,
the plurality of circuit blocks are arranged in a matrix and form cellular automata in which the adjacent circuit blocks are able to communicate with each other,
at least one of the plural circuit blocks is an AUR,
the AUR comprises an AND plane which performs a product operation; an OR plane which is electrically connected with the AND plane and performs an addition operation; a plurality of input gates connected to the AND plane; and output gates which are connected to the OR plane and provided in the same number with the input gates, and
product and addition operations of the signals input from the plural input gates are performed, and the results of the product and addition operations are output from the output gates.

6. A device comprising:
at least one variable logic gate array unit, wherein
at least one said variable logic gate array unit comprises a mechanical element switch for switching a connection in the variable logic gate array unit,
the mechanical element switch is designed to have two stable states or a bistable state,
the variable logic gate array unit comprises at least one logic cell, at least one connection cell; and at least one switch cell, the logic cell, the connection cell, and the switch cell being arranged in a matrix,
each of, at least one said logic cell, at least one said connection cell, and at least one said switch cell, is provided with the above described mechanical element switch,
the logic function of the logic cell, including at least either one of NOR and NAND, is configured to be changeable by the mechanical element switch,
the connections of the connection cell with a wiring and the corresponding, among plural logic cells, a logic cell, are configured to be changeable by the mechanical element switch, and
the connection of the switch cell with the wiring is configured to be changeable by the mechanical element switch.

7. The device according to claim 6, wherein
the mechanical element switch is integrally formed in a CMOS integrated circuit together with the variable logic gate array unit.

8. The device according to claim 6, wherein
either state in the above described bistable state is specified according to a signal from outside the device.

9. A device comprising:
at least one variable logic gate array unit, wherein
at least one said variable logic gate array unit comprises a mechanical element switch for switching a connection in the variable logic gate array unit,
the mechanical element switch is designed to have two stable states or a bistable state,
the variable logic gate array unit comprises at least one logic block, and an interconnection block electrically and mutually connected between the logic blocks,
the mechanical element switch is provided in each of the logic blocks and the interconnection block,
the logic function of the logic block including at least either one of a register and a computing unit is formed to be configurable by the mechanical element switch, and
the interconnection of the interconnection block with the logic function which has been set in the logic block is configured to be switchable by the mechanical element switch.

10. The device according to claim 9, wherein
the mechanical element switch is integrally formed in a CMOS integrated circuit together with the variable logic gate array unit.

11. The device according to claim 9, wherein
either state in the above described bistable state is specified according to a signal from outside the device.

12. A device comprising:
a CPU;
a bus electrically connected with the CPU;
a variable logic gate array unit electrically connected with the bus and electrically connected with the CPU via the bus; and
a writing permission circuit which is able to receive signals from outside, electrically connected to the variable logic gate array unit, and transmits signals regarding the permission of writing to the variable logic gate array unit based on the signals from outside, wherein
the variable logic gate array unit comprises a mechanical element switch for switching the connection in the variable logic gate array unit, and
the mechanical element switch is designed to have two stable states or a bistable state.

13. The device according to claim 12, wherein
the mechanical element switch is integrally formed in a CMOS integrated circuit together with the variable logic gate array unit.

14. The device according to claim 12, wherein
either state in the above described bistable state is specified according to a signal from outside the device.

15. A device comprising:
a CPU;
a bus electrically connected with the CPU;

a variable logic gate array unit electrically connected with the bus and electrically connected with the CPU via the bus; and a wireless interface circuit which is able to receive signals from outside and electrically connected with the variable logic gate array unit, wherein the variable logic gate array unit comprises a mechanical element switch for switching the connection in the variable logic gate array unit, the mechanical element switch is designed to have two stable states or a bistable state, and the connection in the variable logic gate array unit is changeable based on the signals from outside received via the wireless interface circuit.

16. The device according to claim 15, wherein the mechanical element switch is integrally formed in a CMOS integrated circuit together with the variable logic gate array unit.

17. The device according to claim 15, wherein either state in the above described bistable state is specified according to a signal from outside the device.

\* \* \* \* \*